US011825683B2

(12) United States Patent
Kishimoto et al.

(10) Patent No.: US 11,825,683 B2
(45) Date of Patent: Nov. 21, 2023

(54) ORGANIC ELECTROLUMINESCENT DEVICE INCLUDING THIN FILM ENCAPSULATION STRUCTURE AND METHOD FOR PRODUCING SAME

(71) Applicant: SAKAI DISPLAY PRODUCTS CORPORATION, Sakai (JP)

(72) Inventors: Katsuhiko Kishimoto, Sakai (JP); Yozo Narutaki, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/961,878

(22) PCT Filed: Apr. 20, 2018

(86) PCT No.: PCT/JP2018/016350
§ 371 (c)(1),
(2) Date: Nov. 11, 2020

(87) PCT Pub. No.: WO2019/202739
PCT Pub. Date: Oct. 24, 2019

(65) Prior Publication Data
US 2021/0091339 A1 Mar. 25, 2021

(51) Int. Cl.
*H10K 50/844* (2023.01)
*H10K 59/131* (2023.01)
(Continued)

(52) U.S. Cl.
CPC ....... *H10K 50/844* (2023.02); *H10K 59/1213* (2023.02); *H10K 59/131* (2023.02); *H10K 71/00* (2023.02)

(58) Field of Classification Search
CPC . H01L 51/5253; H01L 51/56; H01L 27/3262; H01L 27/3276; H10K 50/844;
(Continued)

(56) References Cited

U.S. PATENT DOCUMENTS 6,104,461 A * 8/2000 Zhang ............... G02F 1/136213
349/122
2005/0062057 A1* 3/2005 Yamazaki ............... H01L 51/56
257/98
(Continued)

FOREIGN PATENT DOCUMENTS

JP 2006-156133 A 6/2006
JP 2009-087860 A 4/2009
(Continued)

*Primary Examiner* — Thao X Le
*Assistant Examiner* — Eric W Jones
(74) *Attorney, Agent, or Firm* — ScienBiziP, P.C.

(57) ABSTRACT

This organic EL device (100) has a substrate (1), a drive circuit layer (2), a first inorganic protective layer (2Pa), an organic planarizing layer (2Pb), an organic EL element layer (3), a second inorganic protective layer (2Pa2), and a TFE structure (10). The TFE structure has a first inorganic barrier layer (12), an organic barrier layer (14), and a second inorganic barrier layer (16). When viewed from a normal line of the substrate, the organic planarizing layer is formed within a region where the first inorganic protective layer is formed, while an organic EL element is disposed within a region where the organic planarizing layer is formed. The TFE structure has an exterior edge which intersects with a lead-out line (32) and which is situated between an exterior edge of the organic planarizing layer and an exterior edge of the first inorganic protective layer. In a portion where the first inorganic protective layer and the first inorganic barrier layer are in direct contact with each other on the lead-out line, the first inorganic barrier layer has, in a cross-section parallel to the line width direction of the lead-out line, a lateral face that is configured to have a taper angle θ (12) of less than 90°. The organic planarizing layer has a surface which exceeds 50 nm in arithmetic average roughness Ra, while the second inorganic protective layer has a surface that is not more than 50 nm in arithmetic average roughness Ra.

11 Claims, 12 Drawing Sheets

(51) Int. Cl.
  *H10K 59/121* (2023.01)
  *H10K 71/00* (2023.01)
(58) Field of Classification Search
  CPC ... H10K 59/131; H10K 59/1213; H10K 71/00
  USPC .................................................. 257/40, 59
  See application file for complete search history.

(56) References Cited

U.S. PATENT DOCUMENTS

| | | | | |
|---|---|---|---|---|
| 2007/0090350 | A1* | 4/2007 | Lee | H01L 51/5275 257/40 |
| 2009/0142888 | A1* | 6/2009 | Tsuchiya | H01L 27/1214 438/151 |
| 2014/0166999 | A1* | 6/2014 | Kim | H01L 27/3258 257/40 |
| 2014/0175399 | A1* | 6/2014 | Choi | H01L 27/3258 257/40 |
| 2015/0036299 | A1* | 2/2015 | Namkung | H05K 1/0271 361/749 |
| 2015/0060822 | A1* | 3/2015 | Kamiya | H01L 51/5225 257/40 |
| 2015/0380685 | A1* | 12/2015 | Lee | H01L 51/5243 257/40 |
| 2016/0043346 | A1 | 2/2016 | Kamiya et al. | |
| 2016/0126495 | A1 | 5/2016 | Oka et al. | |
| 2016/0204373 | A1* | 7/2016 | Park | H01L 27/3223 257/40 |
| 2016/0336374 | A1* | 11/2016 | Jiang | H01L 27/1248 |
| 2017/0018741 | A1 | 1/2017 | Osawa | |
| 2017/0097529 | A1 | 4/2017 | Kubota et al. | |
| 2017/0186368 | A1* | 6/2017 | Hirai | G09G 3/3225 |
| 2017/0221741 | A1* | 8/2017 | Buhl | H01L 21/67276 |
| 2017/0250380 | A1* | 8/2017 | Kato | H01L 51/5253 |
| 2017/0331058 | A1* | 11/2017 | Seo | G09F 9/30 |
| 2018/0033830 | A1* | 2/2018 | Kim | G06F 3/0443 |
| 2018/0123065 | A1 | 5/2018 | Shida et al. | |
| 2019/0019993 | A1 | 1/2019 | Narutaki et al. | |
| 2019/0058160 | A1 | 2/2019 | Kishimoto | |
| 2019/0363288 | A1 | 11/2019 | Narutaki et al. | |
| 2020/0020892 | A1 | 1/2020 | Kishimoto | |
| 2020/0194718 | A1 | 6/2020 | Kishimoto | |
| 2020/0235335 | A1 | 7/2020 | Kishimoto | |

FOREIGN PATENT DOCUMENTS

| | | |
|---|---|---|
| JP | 2013-064187 A | 4/2013 |
| JP | 2013-186971 A | 9/2013 |
| JP | 2013-197463 A | 9/2013 |
| JP | 2014-025058 A | 2/2014 |
| JP | 2015-173078 A | 10/2015 |
| JP | 2016-039120 A | 3/2016 |
| JP | 2016-225091 A | 12/2016 |
| JP | 2017-068927 A | 4/2017 |
| JP | 6301034 B1 | 3/2018 |
| JP | 6321310 B1 | 5/2018 |
| JP | 6487123 B2 | 3/2019 |
| KR | 10-2016-0056487 A | 5/2016 |
| WO | 2014/196137 A1 | 12/2014 |
| WO | 2015/137205 A1 | 9/2015 |
| WO | 2015/178059 A1 | 11/2015 |
| WO | 2018/167923 A1 | 9/2018 |
| WO | 2018/179233 A1 | 10/2018 |
| WO | 2018/229876 A1 | 12/2018 |
| WO | 2019/003305 A1 | 1/2019 |
| WO | 2019/012659 A1 | 1/2019 |
| WO | 2019/106770 A1 | 6/2019 |
| WO | 2019/202738 A1 | 10/2019 |

\* cited by examiner (a)

(b)

(a)

(b)

(c)

(a)

(b)

(c)

(d)

(a)

(b)

(a)

(b)

(a)

(b)

(c)

(a)

(b)

(a)

(b)

(c)

(a)

(b)

US 11,825,683 B2

ORGANIC ELECTROLUMINESCENT DEVICE INCLUDING THIN FILM ENCAPSULATION STRUCTURE AND METHOD FOR PRODUCING SAME

TECHNICAL FIELD

The present invention relates to an organic EL device (e.g., organic EL display device and organic EL illumination device) and a method for producing the same.

BACKGROUND ART

Organic EL (Electroluminescent) display devices start being put into practical use. One feature of an organic EL display device is flexibility thereof. Such an organic EL display device includes, in each of pixels, at least one organic EL element (Organic Light Emitting Diode: OLED) and at least one TFT (Thin Film Transistor) controlling an electric current to be supplied to each of the at least one OLED. Hereinafter, an organic EL display device will be referred to as an "OLED display device". Such an OLED display device including a switching element such as a TFT or the like for each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to allow such thin films to provide a sufficient level of water vapor barrier property. From the point of view of the moisture-resistance reliability of the OLED display device, such a thin film encapsulation structure is typically required to have a WVTR (Water Vapor Transmission Rate) lower than, or equal to, $1 \times 10^{-4}$ g/m²/day.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate. However, such a thick organic barrier layer involves a problem of limiting the bendability of the OLED display device.

There is also a problem that the mass-productivity is low. The relatively thick organic barrier layer described above is formed by use of a printing technology such as an inkjet method, a microjet method or the like. By contrast, an inorganic barrier layer is formed by a thin film formation technology in a vacuum atmosphere (e.g., lower than, or equal to, 1 Pa). The formation of the organic barrier layer by use of a printing method is performed in the air or a nitrogen atmosphere, whereas the formation of the inorganic barrier layer is performed in vacuum. Therefore, the element substrate is put into, and out of, a vacuum chamber during the formation of the thin film encapsulation structure, which decreases the mass-productivity.

Under such a situation, as disclosed in, for example, Patent Document No. 1, a film formation device capable of producing an inorganic barrier layer and an organic barrier layer continuously has been developed.

Patent Document No. 2 discloses a thin film encapsulation structure including a first inorganic material layer, a first resin member and a second inorganic material layer provided on the element substrate in this order, with the first inorganic material layer being closest to the element substrate. In this thin film encapsulation structure, the first resin member is present locally, more specifically, in the vicinity of a protruding portion of the first inorganic material layer (first inorganic material layer covering the protruding portion). According to Patent Document No. 2, since the first resin member is present locally, more specifically, in the vicinity of the protruding portion, which may not be sufficiently covered with the first inorganic material layer, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and vaporized to be mist-like is supplied onto the element substrate maintained at a temperature lower than, or equal to, room temperature. The organic material is condensed and put into liquid drops on the substrate. The organic material in the liquid drops moves on the substrate by a capillary action or a surface tension to be present locally, more specifically, at a border between a side surface of the protruding portion of the first inorganic material layer and a surface of the substrate. Then, the organic material is cured to form the first resin member at the border. Patent Document No. 3 also discloses an OLED display device including a similar thin film encapsulation structure. Patent Document No. 4 discloses a film formation device usable to produce an OLED display device.

CITATION LIST

Patent Literature

Patent Document No. 1: Japanese Laid-Open Patent Publication No. 2013-186971
Patent Document No. 2: WO2014/196137
Patent Document No. 3: Japanese Laid-Open Patent Publication No. 2016-39120
Patent Document No. 4: Japanese Laid-Open Patent Publication No. 2013-64187

SUMMARY OF INVENTION

Technical Problem

The thin film encapsulation structure that is described in each of Patent Documents Nos. 2 and 3 does not include a thick organic barrier layer. Therefore, the thin film encapsulation structure is considered to improve the bendability of the OLED display device. In addition, since the inorganic barrier layer and the organic barrier layer may be formed continuously, the mass-productivity is also improved.

However, according to the studies made by the present inventors, an organic barrier layer formed by the method described in Patent Document No. 2 or 3 has a problem of not providing a sufficiently high level of moisture-resistance reliability.

In the case where an organic barrier layer is formed by use of a printing method such as an inkjet method or the like, it is possible to form the organic barrier layer only in an active region on the element substrate (the active region may also be referred to as an "element formation region" or a "display region") but not in a region other than the active region. In this case, along a periphery of the active region (outer to the active region), there is a region where the first inorganic material layer and the second inorganic material layer are in direct contact with each other, and the organic barrier layer is fully enclosed by the first inorganic material layer and the second inorganic material layer and is isolated from the outside of the first inorganic material layer and the second inorganic material layer.

By contrast, according to the method for forming the organic barrier layer described in Patent Document No. 2 or 3, a resin (organic material) is supplied to the entire surface of the element substrate, and the surface tension of the resin, which is in a liquid state, is used to locate the resin locally, more specifically, at the border between the surface of the element substrate and the side surface of the protruding portion on the surface of the element substrate. Therefore, the organic barrier layer may also be formed in a region other than the active region (the region other than the active region may also be referred to as a "peripheral region"), namely, a terminal region where a plurality of terminals are located and a lead wire region where lead wires extending from the active region to the terminal region are formed. Specifically, the resin is present locally, more specifically, at, for example, the border between side surfaces of the lead wires or side surfaces of the terminals and the surface of the substrate. In this case, an end of a portion, of the organic barrier layer, that is formed along the lead wires is not enclosed by the combination of the first inorganic barrier layer and the second inorganic barrier layer, but is exposed to the air (ambient atmosphere).

The organic barrier layer is lower in the water vapor barrier property than the inorganic barrier layer. Therefore, the organic barrier layer formed along the lead wires acts as a route that leads water vapor in the air to the active region.

In the above, some problems of a thin film encapsulation structure preferably usable for a flexible organic EL display device are described. The thin film encapsulation structure is not limited to being used for an organic EL display device, but is also usable for other types of organic EL devices such as an organic EL illumination device and the like.

The present invention, made to solve the above-described problems, has an object of providing an organic EL device including a thin film encapsulation structure that includes a relatively thin organic barrier layer, by which the mass-productivity and the moisture-resistance reliability are improved, and also providing a method for producing the same.

Solution to Problem

An organic EL device according to an embodiment of the present invention includes a substrate; a driving circuit layer including a plurality of TFTs formed on the substrate, a plurality of gate bus lines and a plurality of source bus lines each connected with either one of the plurality of TFTs, a plurality of terminals, and a plurality of lead wires each connecting either one of the plurality of terminals and either one of the plurality of gate bus lines or either one of the plurality of source bus lines to each other; a first inorganic protective layer formed on the driving circuit layer and exposing at least the plurality of terminals; an organic flattening layer formed on the first inorganic protective layer and having a surface that has an arithmetic average roughness of greater than 50 nm; a second inorganic protective layer formed on the organic flattening layer and having a surface that has an arithmetic average roughness of 50 nm or less; an organic EL element layer including a plurality of organic El elements formed on the second inorganic protective layer and each connected with either one of the plurality of TFTs; and a thin film encapsulation structure formed so as to cover the organic EL element layer and including a first inorganic barrier layer, an organic barrier layer in contact with a top surface of the first inorganic barrier layer and a second inorganic barrier layer in contact with a top surface of the organic barrier layer, the organic barrier layer being formed in a region enclosed by an inorganic barrier layer joint portion where the first inorganic barrier layer and the second inorganic barrier layer are in direct contact with each other. As viewed in a direction of normal to the substrate, the organic flattening layer is formed in a region where the first inorganic protective layer is formed, the plurality of organic EL elements are located in a region where the organic flattening layer is formed, an outer perimeter of the thin film encapsulation structure crosses the plurality of lead wires and is present between an outer perimeter of the organic flattening layer and an outer perimeter of the first inorganic protective layer. In a portion where the first inorganic protective layer and the first inorganic barrier layer are in direct contact with each other on the plurality of lead wires, a side surface of a cross-sectional shape, of the first inorganic barrier layer, that is parallel to a line width direction of the plurality of lead wires has a tapering angle of less than 90 degrees.

In an embodiment, the tapering angle of the side surface of the first inorganic barrier layer is less than 70 degrees.

In an embodiment, the organic flattening layer is formed of a non-photosensitive resin.

In an embodiment, the organic flattening layer is formed of polyimide.

A method for producing an organic EL device according to an embodiment of the present invention is a method for producing the organic EL device of any one of the above. The method includes step A of forming the driving circuit layer on the substrate; step B of forming a first inorganic protective film on the driving circuit layer; step C of forming an organic flattening film on the first inorganic protective film; step D of forming a second inorganic protective film on the organic flattening film; step E of treating a surface of the second inorganic protective film with chemical mechanical polishing; step F of patterning the first inorganic protective film, the organic flattening film and the second inorganic protective film to form the first inorganic protective layer, the organic flattening layer and the second inorganic protective layer; step G of baking the organic flattening layer to a temperature of 100° C. or higher; and step H of, after the step G, forming an organic layer on the second inorganic protective layer, the organic layer being contained in the organic EL elements.

In an embodiment, the step F includes the step of forming a contact hole running through the first inorganic protective film, the organic flattening film and the second inorganic protective film in one step.

In an embodiment, the method further includes: after the step F but before the step G, step F1 of forming a positive photoresist film covering the organic flattening layer, and step F2 of exposing the entirety of the photoresist film to light and then developing the photoresist film to remove the photoresist film.

In an embodiment, the method further includes the step of, between the step F1 and the step F2, storing or transporting the substrate having the photoresist film formed thereon.

In an embodiment, the method further includes step I of, after the step H, forming the first inorganic barrier layer selectively on an active region where the plurality of organic EL elements are formed; step J of, after the step I, locating the substrate in a chamber and supplying vapor of a photocurable resin or a mist-like photocurable resin into the chamber; step K of condensing the photocurable resin on the first inorganic barrier layer such that the photocurable resin is not present on a portion, of the first inorganic barrier layer, that has the tapering angle of less than 90 degrees; and step L of, after the step K, irradiating the condensed photocurable resin with light to form the organic barrier layer of a photocured resin.

In an embodiment, the method further includes step I of, after the step G, forming the first inorganic barrier layer selectively on an active region where the plurality of organic EL elements are formed; step J of, after the step I, locating the substrate in a chamber and supplying vapor of a photocurable resin or a mist-like photocurable resin into the chamber; step K of condensing the photocurable resin on the first inorganic barrier layer to form a liquid film; step L of irradiating the liquid film of the photocurable resin with light to form a photocured resin layer; and step M of partially ashing the photocured resin layer to form the organic barrier layer.

Advantageous Effects of Invention

An embodiment of the present invention provides an organic EL device including a thin film encapsulation structure that includes a relatively thin organic barrier layer, by which the mass-productivity and the moisture-resistance reliability are improved, and also provides a method for producing the same.

BRIEF DESCRIPTION OF DRAWINGS

FIG. 3(a) is a cross-sectional view taken along line 3A-3A' in FIG. 2, and FIG. 3(b) is a cross-sectional view taken along line 3B-3B' in FIG. 2.

FIG. 4(a) is a cross-sectional view taken along line 4A-4A' in FIG. 2, FIG. 4(b) is a cross-sectional view taken along line 4B-4B' in FIG. 2, FIG. 4(c) is a cross-sectional view taken along line 4C-4C' in FIG. 2, and FIG. 4(d) is a cross-sectional view taken along line 4D-4D' in FIG. 2.

FIG. 7(a) is a cross-sectional view taken along line 7A-7A' in FIG. 6, and FIG. 7(b) is a cross-sectional view taken along line 7B-7B' in FIG. 6.

FIG. 8(a) is a cross-sectional view taken along line 8A-8A' in FIG. 6, FIG. 8(b) is a cross-sectional view taken along line 8B-8B' in FIG. 6, and FIG. 8(c) is a cross-sectional view taken along line 8C-8C' in FIG. 6.

FIG. 12(a) shows a state of the film formation device 200 in a step of condensing a photocurable resin on a first inorganic barrier layer, and FIG. 12(b) shows a state of the film formation device 200 in a step of curing the photocurable resin.

DESCRIPTION OF EMBODIMENTS

Hereinafter, an OLED display device and a method for producing the same according to an embodiment of the present invention will be described with reference to the drawings. In the following, an OLED display device including a flexible substrate will be described as an example. Nonetheless, embodiments of the present invention are not limited to being directed to an organic EL display device, but may be directed to another organic EL device such as an organic EL illumination device or the like. Embodiments of the present invention are not limited to the embodiments described below as examples.

Figure 1:
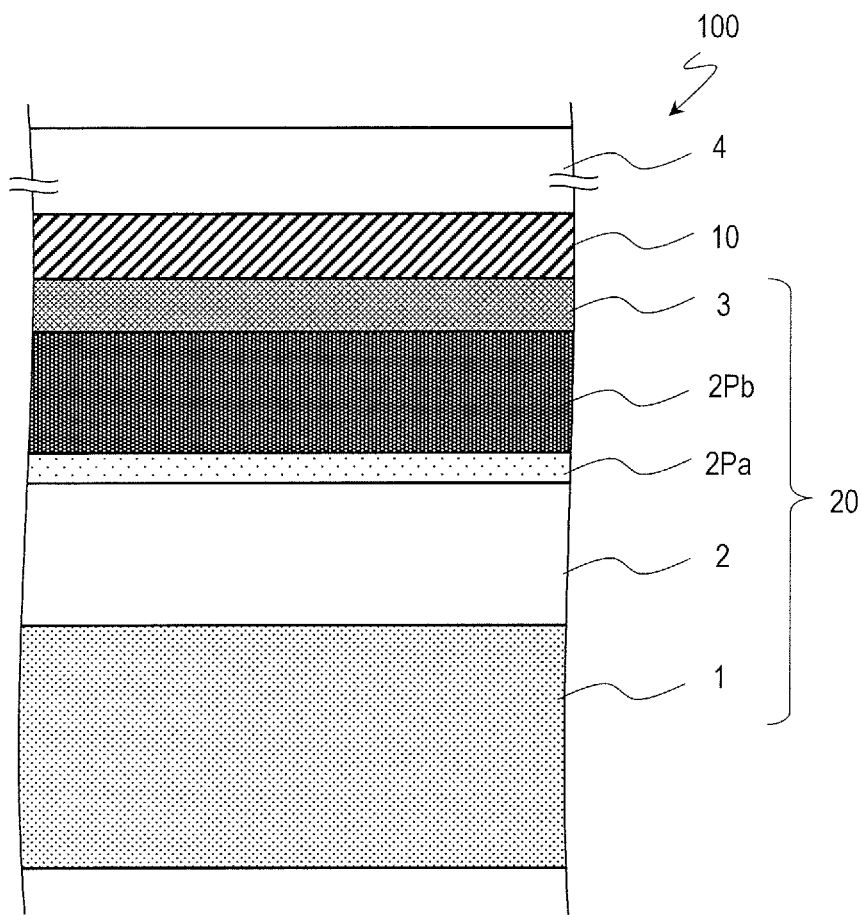
FIG. 1(a) is a schematic partial cross-sectional view of an active region of an OLED display device 100 according to an embodiment of the present invention.
FIG. 1(b) is a partial cross-sectional view of a TFE structure 10 formed on an OLED 3.
Figure 1:
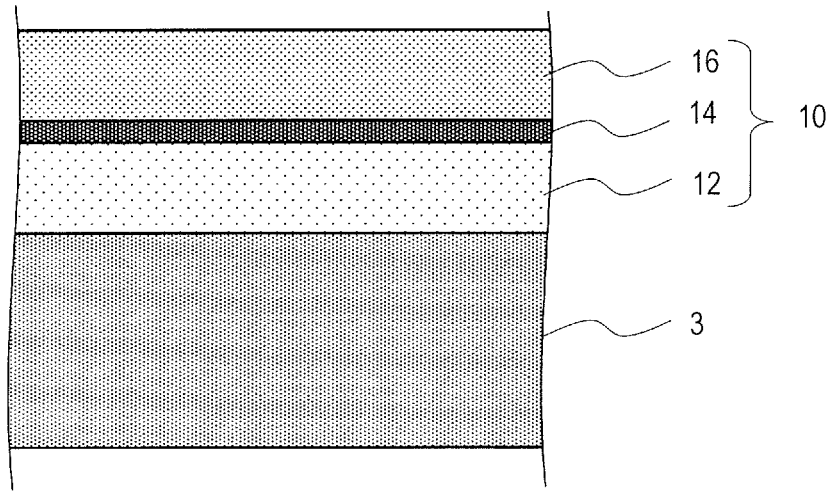

First, with reference to FIG. 1(a) and FIG. 1(b), a basic structure of an OLED display device 100 according to an embodiment of the present invention will be described. FIG. 1(a) is a schematic partial cross-sectional view of an active region of the OLED display device 100 according to an embodiment of the present invention. FIG. 1(b) is a partial cross-sectional view of a TFE structure 10 formed on an OLED 3.

The OLED display device 100 includes a plurality of pixels, and each of the pixels includes at least one organic EL element (OLED). Herein, a structure corresponding to one OLED will be described for the sake of simplicity.

As shown in FIG. 1(a), the OLED display device 100 includes a flexible substrate (hereinafter, may be referred to simply as a "substrate") 1, a circuit (may be referred to as a "driving circuit" or a "backplane") 2 formed on the substrate 1 and including a TFT, an inorganic protective layer (first inorganic protective layer) 2Pa formed on the circuit 2, an organic flattening layer 2Pb formed on the inorganic protective layer 2Pa, the OLED 3 formed on the organic flattening layer 2Pb, and the TFE structure 10 formed on the OLED 3. Hereinafter, an assembly of the substrate 1, the circuit 2 formed on the substrate 1, the inorganic protective layer 2Pa, the organic flattening layer 2Pb and the OLED 3 may be referred to as an "element substrate 20". Namely, the assembly of the substrate 1 and the components that are formed on the substrate 1 and are closer to the substrate 1 than the TFE structure 10 may be referred to as the "element substrate".

The OLED 3 is, for example, of a top emission type. An uppermost portion of the OLED 3 is, for example, an upper electrode or a cap layer (refractive index adjusting layer). A layer including a plurality of the OLEDs 3 may be referred to as an "OLED layer 3". An optional polarizing plate 4 is located on the TFE structure 10. The circuit 2 and the OLED layer 3 may share a part of the components. For example, a layer having a touch panel function may be located between the TFE structure 10 and the polarizing plate 4. Namely, the OLED display device 100 may be altered to a display device including an on-cell type touch panel.

The substrate 1 is, for example, a polyimide film having a thickness of 15 µm. The circuit 2 including the TFT has a thickness of, for example, 4 µm. The inorganic protective layer 2Pa has a structure of, for example, $SiN_x$ layer (500 nm)/$SiO_2$ layer (100 nm) (top layer/bottom layer). Alternatively, the inorganic protective layer 2Pa may have a three-layer structure of, for example, $SiO_2$ layer/$SiN_x$ layer/$SiO_2$ layer. These layers may have thicknesses of, for example, 200 nm/300 nm/100 nm. Still alternatively, the inorganic protective layer 2Pa may be a single layer of $SiN_x$ (200 nm). The organic flattening layer 2Pb is, for example, an acrylic resin layer, an epoxy resin layer or a polyimide layer having a thickness of 4 µm. The organic flattening layer 2Pb is preferably formed of a non-photosensitive resin, but may be formed of a photosensitive resin. The OLED 3 has a thickness of, for example, 1 µm. The TFE structure 10 has a thickness of, for example, 2.5 µm or less.

FIG. 1(b) is a partial cross-sectional view of the TFE structure 10 formed on the OLED 3. A first inorganic barrier layer (e.g., $SiN_x$ layer) 12 is formed immediately on the OLED 3, an organic barrier layer (e.g., acrylic resin layer) 14 is formed on the first inorganic barrier layer 12, and a second inorganic barrier layer (e.g., $SiN_x$ layer) 16 is formed on the organic barrier layer 14.

For example, the first inorganic barrier layer 12 is an $SiN_x$ layer having a thickness of, for example, 1.5 µm, the second inorganic barrier layer 16 is an $SiN_x$ layer having a thickness of, for example, 800 nm, and the organic barrier layer 14 is an acrylic resin layer having a thickness of, for example, less than 100 nm. Each of the first inorganic barrier layer 12 and the second inorganic barrier layer 16 independently has a thickness of 200 nm or greater and 1500 nm or less. The organic barrier layer 14 has a thickness of 50 nm or greater and less than 200 nm. The TFE structure has a thickness of, preferably, 400 nm or greater and less than 3 µm, and more preferably, 400 nm or greater and 2.5 µm or less.

The TFE structure 10 is formed to protect the active region (see the active region R1 in FIG. 2) of the OLED display device 100. As described above, the TFE structure 10 includes, on the active region R1, the first inorganic barrier layer 12, the organic barrier layer 14 and the second inorganic barrier layer 16 sequentially provided with the first inorganic barrier layer 12 being closest to the OLED 3. The organic barrier layer 14 is not present as a film covering the entirety of the active region R1, but has an opening. A portion, of the organic barrier layer 14, that excludes the opening, namely, a portion where an organic film is actually present, will be referred to as a "solid portion". The organic barrier layer 14 may be formed by the method described in, for example, Patent Document No. 1 or 2 or by use of a film formation device 200 described below.

The "opening" (may also be referred to as a "non-solid portion") does not need to be enclosed by the solid portion, but includes a cutout portion or the like. In the opening, the first inorganic barrier layer 12 and the second inorganic barrier layer 16 are in direct contact with each other. Hereinafter, a portion where the first inorganic barrier layer 12 and the second inorganic barrier layer 16 are in direct contact with each other will be referred to as an "inorganic barrier layer joint portion".

Now, with reference to FIG. 2 and FIG. 3, a structure of, and a method for producing, an OLED display device 100A according to an embodiment of the present invention will be described.

Figure 2:
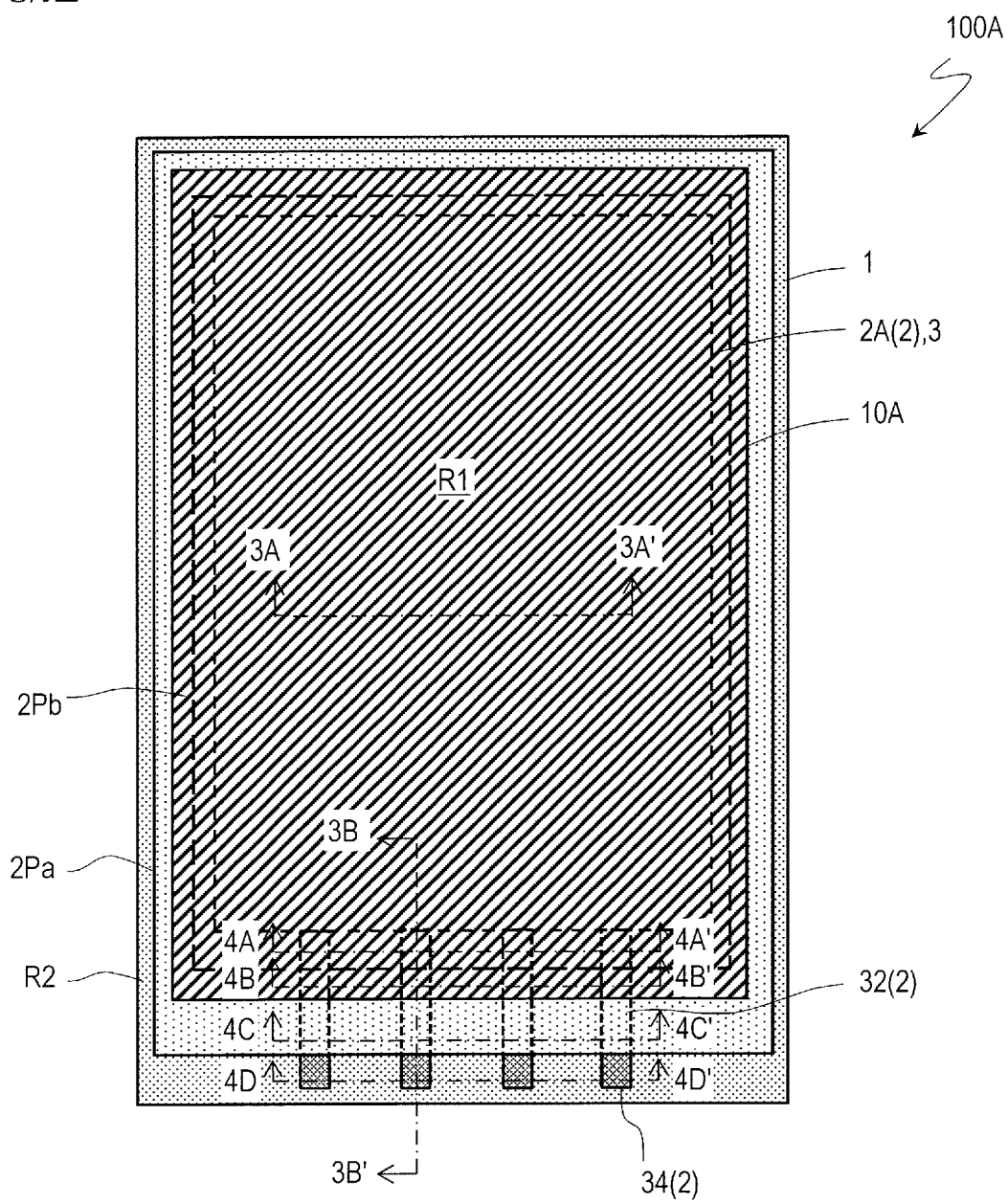
FIG. 2 is a schematic plan view of an OLED display device 100A according to an embodiment of the present invention.
Figure 3:
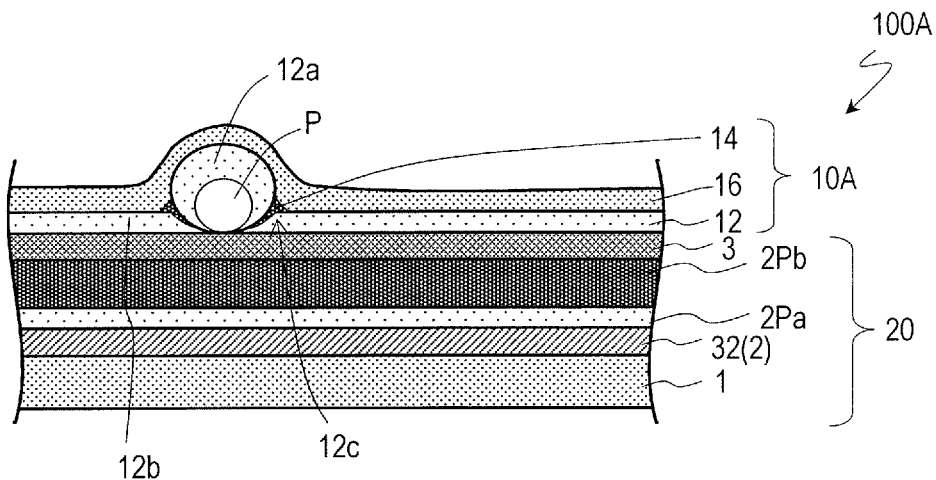
FIG. 3(a) and FIG. 3(b) are each a schematic cross-sectional view of the OLED display device 100A.
FIG. 3(c) is a cross-sectional view showing tapering angles θ of side surfaces of layers.
Figure 3:
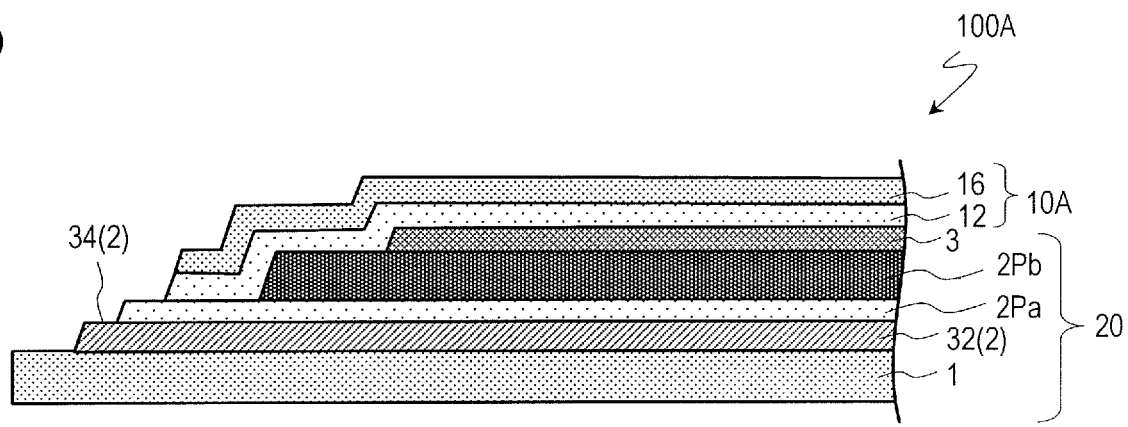
Figure 3:
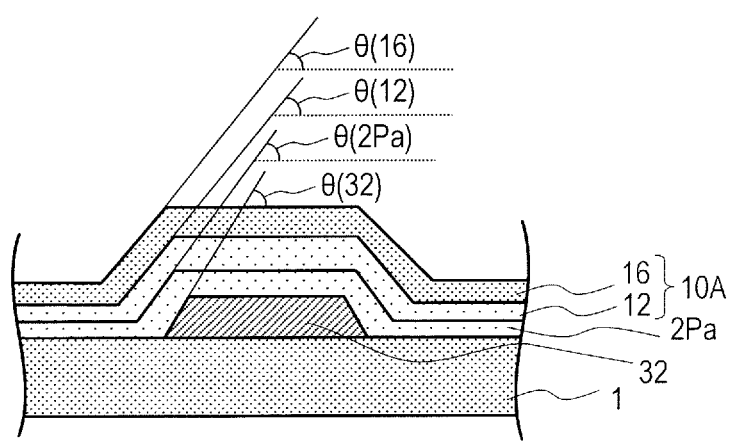
Figure 4:
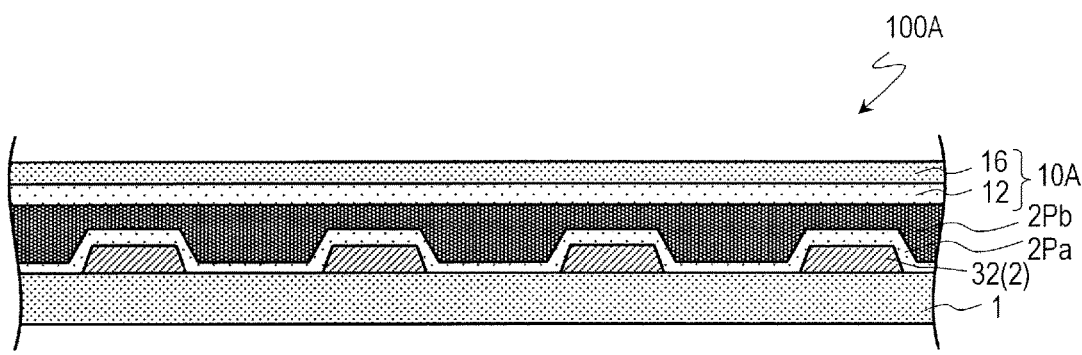
FIG. 4(a) through FIG. 4(d) are each a schematic cross-sectional view of the OLED display device 100A.
Figure 4:
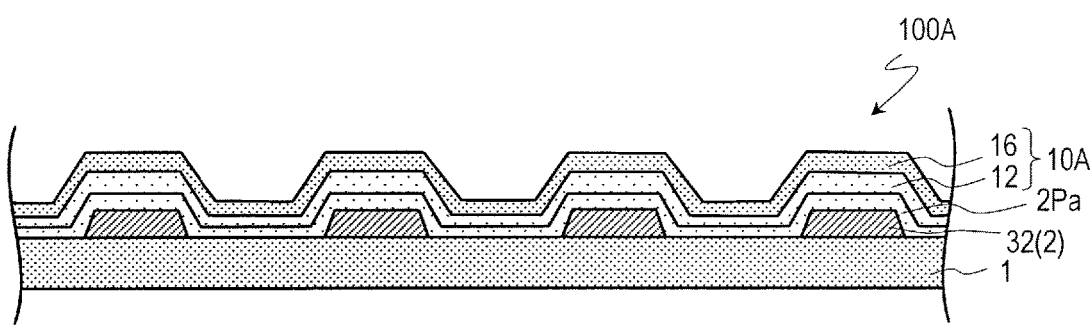
Figure 4:
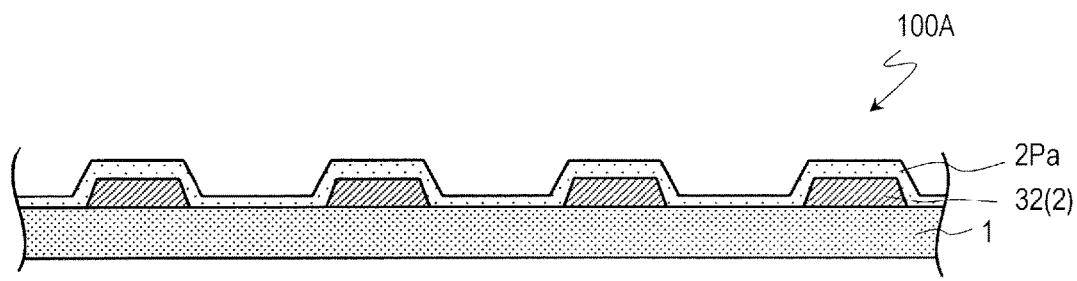
Figure 4:
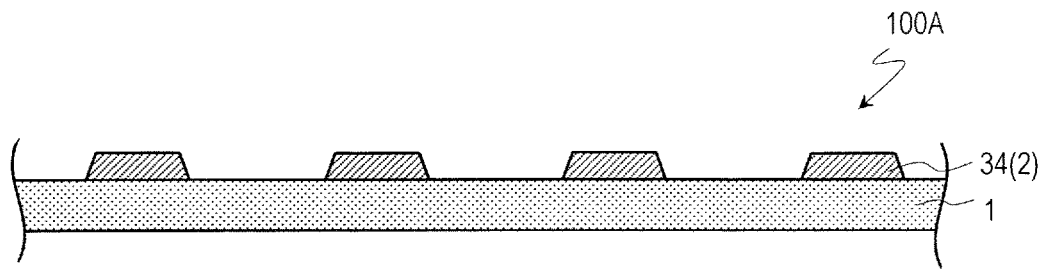

FIG. 2 shows a schematic plan view of the OLED display device 100A according to an embodiment of the present invention. With reference to FIG. 3(a) through FIG. 3(c) and FIG. 4(a) through FIG. 4(d), a cross-sectional structure of the OLED display device 100A will be described. FIG. 3(a) and FIG. 3(b) are each a schematic cross-sectional view of the OLED display device 100A. FIG. 3(a) is a cross-sectional view taken along line 3A-3A' in FIG. 2, and FIG. 3(b) is a cross-sectional view taken along line 3B-3B' in FIG. 2. FIG. 3(c) is a cross-sectional view showing tapering angles θ of side surfaces of layers. FIG. 4(a) through FIG. 4(d) are each a schematic cross-sectional view of the OLED display device 100A. FIG. 4(a) is a cross-sectional view taken along line 4A-4A' in FIG. 2. FIG. 4(b) is a cross-sectional view taken along line 4B-4B' in FIG. 2. FIG. 4(c) is a cross-sectional view taken along line 4C-4C' in FIG. 2. FIG. 4(d) is a cross-sectional view taken along line 4D-4D' in FIG. 2.

First, FIG. 2 will be referred to. The circuit 2 formed on the substrate 1 includes a plurality of TFTs (not shown), and a plurality of gate bus lines (not shown) and a plurality of source bus lines (not shown) each connected to either one of the plurality of TFTs (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The circuit 2 further includes a plurality of terminals 34 located in a peripheral region R2 outer to the active region (region enclosed by the dashed line in FIG. 2) R1, where the plurality of OLEDs 3 are located, and also includes a plurality of lead wires 32 each connecting either one of the plurality of terminals 34 and either one of the plurality of gate bus lines or either one of the plurality of source bus lines to each other. The entirety of the circuit 2 including the plurality of TFTs, the plurality of gate bus lines, the plurality of source bus lines, the plurality of lead wires 32 and the plurality of terminals 34 may be referred to as a "driving circuit layer 2". A portion, of the driving circuit layer 2, that is formed in the active region R1 will be referred to as a "driving circuit layer 2A".

In FIG. 2 and the like, only the lead wires 32 and/or the terminals 34 may be shown as components of the driving circuit layer 2. Nonetheless, the driving circuit layer 2 includes a conductive layer including the lead wires 32 and the terminals 34 and further includes at least one conductive layer, at least one insulating layer, and at least one semiconductor layer. The structure of the conductive layers, the insulating layer and the semiconductor layer included in the driving circuit layer 2 may be changed in accordance with the structure of the TFT shown in, for example, FIG. 9(a) or FIG. 9(b) as an example. An insulating film (base coat) may be formed on the substrate 1 as an underlying layer for the driving circuit layer 2.

As viewed in a direction of normal to the substrate 1, the organic flattening layer 2Pb is formed in a region where the inorganic protective layer 2Pa is formed. The active region R1 (2A, 3) is formed in a region where the organic flattening layer 2Pb is formed. An outer perimeter of the TFE structure 10 crosses the plurality of lead wires 32, and is present between an outer perimeter of the organic flattening layer 2Pb and an outer perimeter of the inorganic protective layer 2Pa. Therefore, the organic flattening layer 2Pb is enclosed, together with the OLED layer 3, by a joint portion where the inorganic protective layer 2Pa and the first inorganic barrier layer 12 are in direct contact with each other (see FIG. 3(b) and FIG. 4(b)). The inorganic protective layer 2Pa is formed by, for example, plasma CVD using a mask (e.g., metal mask) so as to expose at least the plurality of terminals 34. Alternatively, the inorganic protective layer 2Pa may be formed as follows, for example. An inorganic protective film is formed by plasma CVD so as to cover the terminals 34 and then is patterned by a photolithography process (including a dry etching step), so that an opening exposing the terminals 34 is formed. As described below, in the case where a second inorganic protective layer 2Pa2 is formed on the organic flattening layer 2Pb (see FIG. 11(b)), it is preferred that the patterning including the formation of a contact hole is performed in one step for an inorganic protective film 2Pa (first inorganic protective film 2Pa1), an organic flattening film 2Pb and the second inorganic protective film 2Pa2.

Figure 6:
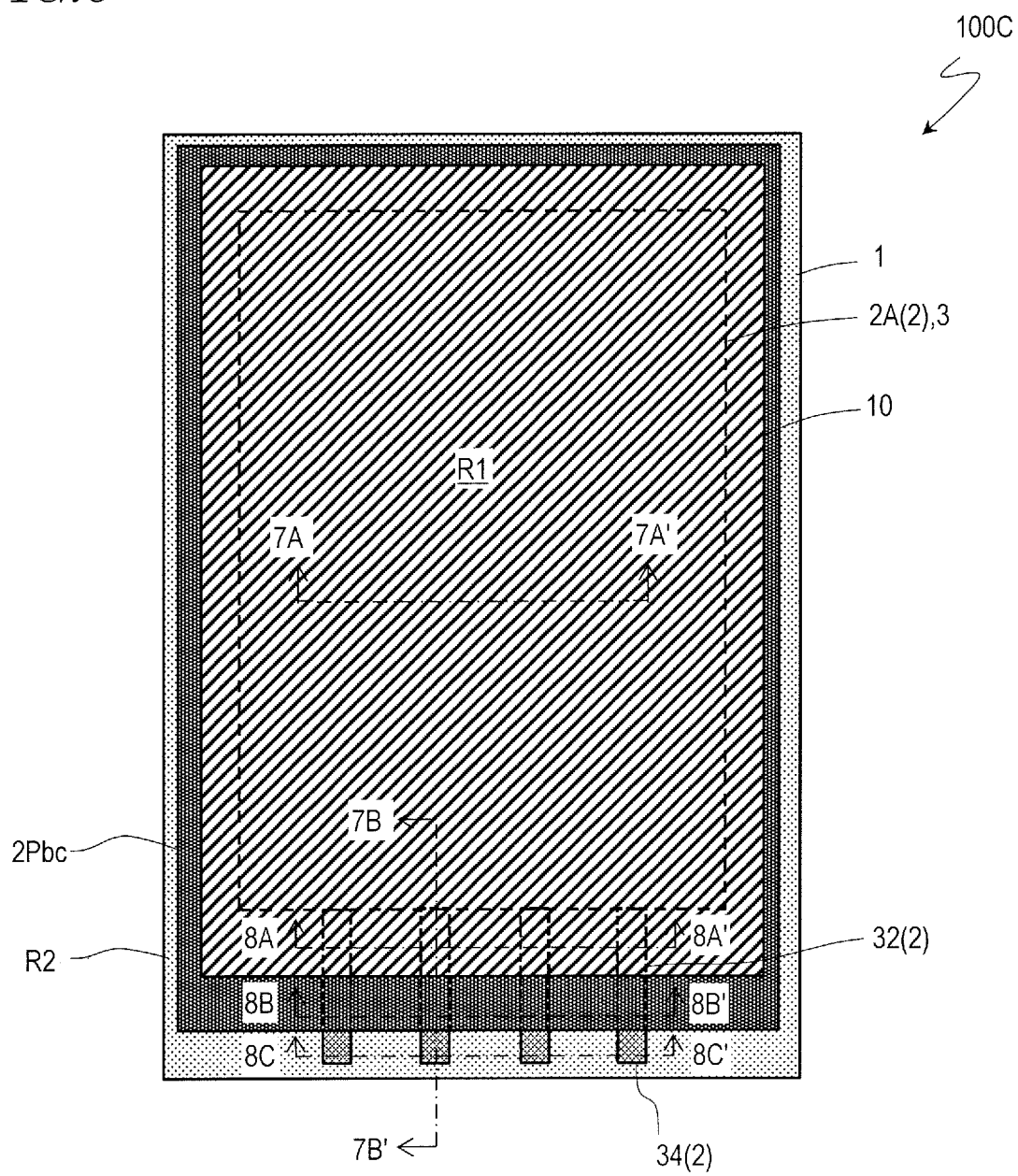
FIG. 6 is a schematic plan view of an OLED display device 100C according to a comparative example.
Figure 7:
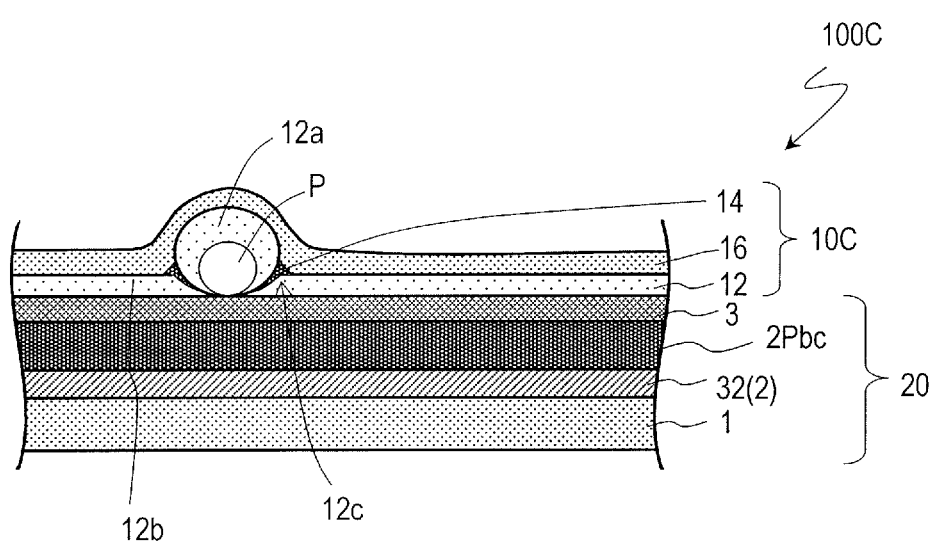
FIG. 7(a) and FIG. 7(b) are each a schematic cross-sectional view of the OLED display device 100C.
Figure 7:
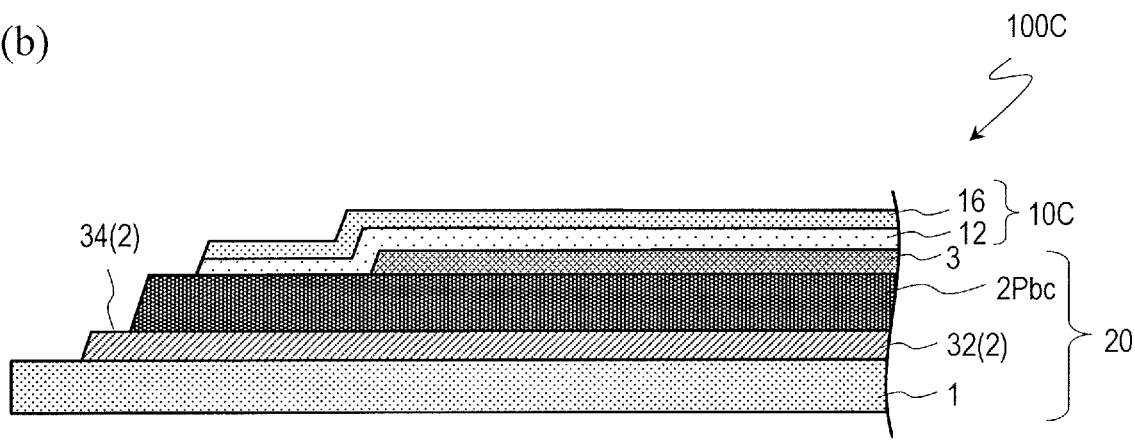
Figure 8:
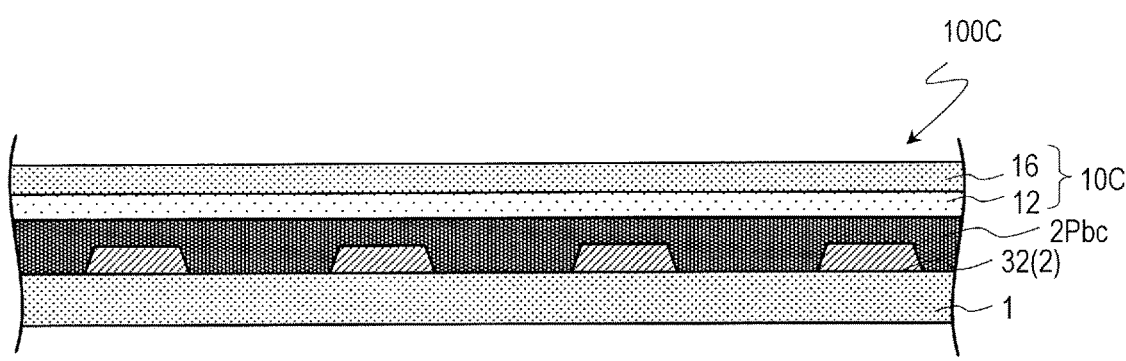
FIG. 8(a) through FIG. 8(c) are each a schematic cross-sectional view of the OLED display device 100C.
Figure 8:
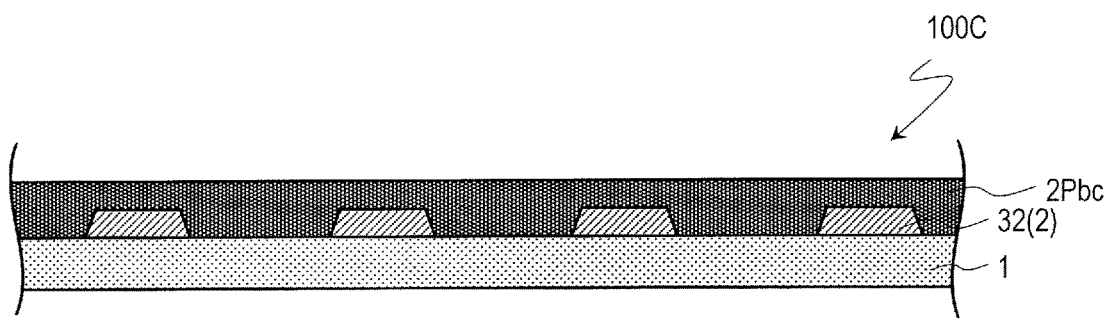
Figure 8:
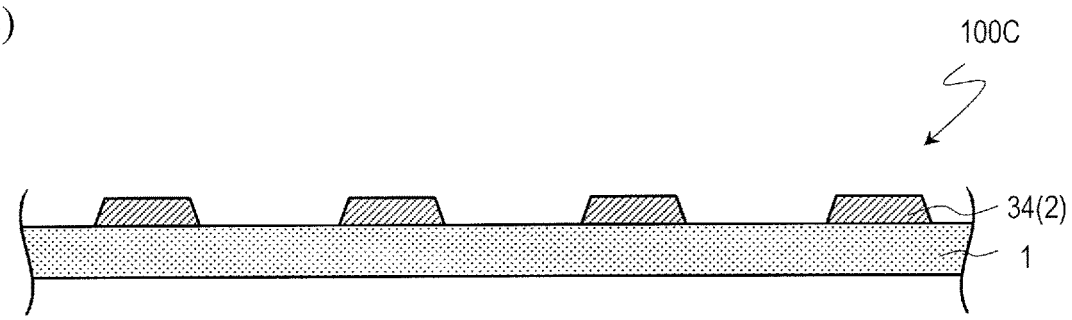

The inorganic protective layer 2Pa protects the driving circuit layer 2. The organic flattening layer 2Pb flattens a surface of an underlying layer on which the OLED layer 3 is to be formed. Like the organic barrier layer 14, the organic flattening layer 2Pb has a water vapor barrier property lower than that of the inorganic protective layer 2Pa or the inorganic barrier layer 12 or 16. Therefore, as shown in FIG. 6 through FIG. 8 regarding an OLED display device 100C according to a comparative example, in the case where an organic flattening layer 2Pbc is partially exposed to the air (ambient atmosphere), the organic flattening layer 2Pbc absorbs moisture from the exposed portion. As a result, the organic flattening layer 2Pbc acts as a route that guides the moisture in the air into the active region R1. As described above, in the OLED display device 100 according to an embodiment, the organic flattening layer 2Pb is enclosed by the joint portion where the inorganic protective layer 2Pa and the first inorganic barrier layer 12 are in direct contact with each other. Therefore, the organic flattening layer 2Pb is prevented from guiding the moisture into the active region R1.

The organic flattening layer 2Pb is formed of an organic resin. As the organic resin, an acrylic resin, an epoxy resin or a polyimide resin is preferably usable. The organic flattening layer 2Pb is obtained by patterning an organic resin film formed by any of various application methods or printing methods. The organic resin film is formed of, for example, a non-photosensitive resin. It should be noted that a photosensitive resin may be used. It is preferred that a positive photosensitive resin is used as the photosensitive resin. Use of a photosensitive resin allows the organic resin film to be formed only in a predetermined region by a photolithography process. For example, a photosensitive film is applied onto substantially the entirety of the element substrate and then is exposed to light and developed, so that the organic resin film may be formed in a predetermined region excluding a peripheral region of the element substrate (see, for example, FIG. 11(c)).

Regarding the patterning of the organic resin film, in the case where the second inorganic protective layer 2Pa2 is formed on the organic flattening layer 2Pb (see FIG. 11(b)), it is preferred that the contact hole is formed in one step in the inorganic protective film 2Pa (first inorganic protective film 2Pa1), the organic flattening film 2Pb and the second inorganic protective film 2Pa2.

An organic resin easily absorbs moisture. Meanwhile, as described above, the OLED (especially, an organic light emitting layer and a cathode electrode material) is easily influenced by moisture to be deteriorated. Therefore, it is preferred that before the OLED layer 3 is formed on the organic flattening layer 2Pb, baking is performed in order to remove the moisture contained in the organic flattening layer 2Pb. The baking temperature is preferably, for example, 100° C. or higher (e.g., for 1 hours or longer), and more preferably 250° C. or higher (e.g., for 15 minutes or longer). The atmosphere may be an atmospheric pressure. Baking in a low pressure atmosphere may shorten the baking time. It is preferred to use a resin material having a high thermal resistance, for example, polyimide, in order to prevent deterioration by heat in the baking step.

There are cases where after the organic flattening layer 2Pb is formed but before the OLED layer 3 is formed, the element substrate is stored or transported. Namely, after the element substrate including the driving circuit layer 2, the inorganic protective layer 2Pa and the organic flattening layer 2Pb is formed but before the OLED layer 3 is formed, there may be a certain period of time (e.g., the element substrate is stored for at least one day or for several days) or the element substrate may be transported to a different plant. One method to prevent contamination of a surface of the organic flattening layer 2Pb during such a time period or to prevent adhesion of dust to the surface during the transportation may be, for example, forming a positive photoresist film that covers the organic flattening layer 2Pb. The photoresist film is preferably formed as follows. A photoresist solution is applied and then prebaking is performed (the solvent is volatilized to be removed; for example, baking is performed in a temperature range of about 90° C. or higher and about 110° C. or lower for about 5 minutes to about 30 minutes). The photoresist film is removed after the storage or the transportation but immediately before the formation of the OLED layer 3, so that a clean surface of the organic flattening layer 2Pb may be obtained. The photoresist film is preferably removed as follows. The photoresist film is entirely exposed to light and then is developed with no post-baking usually performed; or after the prebaking, the photoresist film is released by a release solution without being entirely exposed to light. A preferably usable material to form the positive photoresist film is, for example, OFPR-800 produced by Tokyo Ohka Kogyo Co., Ltd., which is a positive photoresist.

As described below with reference to FIG. 11(b), a bank layer may be formed during the formation of the OLED element 3. The bank layer is formed after a lower electrode is formed but before an organic layer (organic EL layer) is formed. The bank layer is formed of an organic resin (e.g., polyimide), and therefore, easily absorbs moisture and contacts the organic layer. For these reasons, it is preferred to bake the bank layer to remove the moisture in the bank layer. After the organic flattening layer 2Pb is formed and also the lower electrode and the bank layer are formed, a positive photoresist film that protects a surface of the element substrate may be formed as described above. After the necessary storage and/or transportation, the photoresist film is removed as described above and the element substrate is baked immediately before the formation of the organic layer, so that the moisture contained in the organic flattening layer 2Pb and the bank layer is removed. In this manner, the baking step of removing the moisture contained in the organic flattening layer 2Pb and the baking step of removing the moisture contained in the bank layer may be performed as one step. Needless to say, the baking steps may be performed as follows. After the organic flattening layer 2Pb is protected with a positive photoresist film and the positive photoresist film is removed as described above, a baking step of removing the moisture contained in the organic flattening layer 2Pb is performed. After this, the lower electrode and the bank layer are formed, and then a baking step of removing the moisture contained in the bank layer is performed before the organic layer is formed.

Now, with reference to FIG. 3(a) through FIG. 3(c) and FIG. 4(a) through FIG. 4(d), the cross-sectional structure of the OLED display device 100A will be described in more detail.

As shown in FIG. 3(a), FIG. 3(b), FIG. 4(a) and FIG. 4(b), a TFE structure 10A includes the first inorganic barrier layer 12 formed on the OLED 3, the organic barrier layer 14 in contact with the first inorganic barrier layer 12 and the second inorganic barrier layer 16 in contact with the organic barrier layer 14. The first inorganic barrier layer 12 and the second inorganic barrier layer 16 are each, for example, an $SiN_x$ layer, and are each selectively formed by plasma CVD using a mask only in a predetermined region so as to cover the active region R1.

The organic barrier layer 14 may be formed by, for example, the method described in Patent Document No. 2 or 3 mentioned above. For example, in a chamber, vapor of an organic material (e.g., acrylic monomer) or a mist-like organic material is supplied onto the element substrate maintained at a temperature lower than, or equal to, room temperature and is condensed on the element substrate. The organic material put into a liquid state is located locally, more specifically, at a border between a side surface of a protruding portion of, and a flat portion of, the first inorganic barrier layer 12 by a capillary action or a surface tension of the organic material. Then, the organic material is irradiated with, for example, ultraviolet rays to form a solid portion of the organic barrier layer (e.g., acrylic resin layer) 14 at the above-mentioned border in the vicinity of the protruding portion. The organic barrier layer 14 formed by this method does not substantially include the solid portion on the flat portion. Regarding the method for forming the organic barrier layer, the disclosures of Patent Documents Nos. 2 and 3 are incorporated herein by reference.

Alternatively, the organic barrier layer 14 may be formed by adjusting an initial thickness of the resin layer to be formed by use of the film formation device 200 (e.g., to less than 100 nm) and/or by performing ashing on the resin layer once formed. As described below in detail, the ashing may be performed by plasma ashing using, for example, at least one type of gas among $N_2O$, $O_2$ and $O_3$.

FIG. 3(a) is a cross-sectional view taken along line 3A-3A' in FIG. 2, and shows a portion including a particle P. The particle P is a microscopic dust particle generated during the production of the OLED display device, and is, for example, a microscopic piece of broken glass, a metal particle or an organic particle. Such a particle is generated especially easily in the case where mask vapor deposition is used.

As shown in FIG. 3(a), the organic barrier layer (solid portion) 14 may be formed only in the vicinity of the particle P. A reason for this is that the acrylic monomer supplied after the first inorganic barrier layer 12 is formed is condensed and present locally, more specifically, in the vicinity of a surface of a first inorganic barrier layer 12a on the particle P (the surface has a tapering angle θ of 90 degrees or larger).

The opening (non-solid portion) of the organic barrier layer 14 is on the flat portion of the first inorganic barrier layer 12.

In the case where the particle (having a diameter of, for example, 1 μm or longer) P is present, a crack (defect) 12c may be formed in the first inorganic barrier layer 12. This is considered to be caused by impingement of the $SiN_x$ layer 12a growing from a surface of the particle P and an $SiN_x$ layer 12b growing from a flat portion of a surface of the OLED 3. In the case where such a crack 12c is present, the level of barrier property of the TFE structure 10A is decreased.

In the TFE structure 10A in the OLED display device 100A, as shown in FIG. 3(a), the organic barrier layer 14 is formed to fill the crack 12c of the first inorganic barrier layer 12, and a surface of the organic barrier layer 14 couples the surface of the first inorganic barrier layer 12a on the particle P and a surface of the first inorganic barrier layer 12b on the flat portion of the OLED 3 to each other continuously and smoothly. Therefore, the second inorganic barrier layer 16, which is formed on the first inorganic barrier layer 12a on the particle P and also on the organic barrier layer 14, is a fine film with no defect. As can be seen, even if the particle P is present, the organic barrier layer 14 may keep high the level of barrier property of the TFE structure 10A.

Now, with reference to FIG. 3(b) and FIG. 4(a) through FIG. 4(d), a cross-sectional structure on the lead wires 32 and the terminals 34 will be described.

As shown in FIG. 3(b), the lead wires 32 and the terminals 34 are integrally formed on the substrate 1. The inorganic protective layer 2Pa is formed on the lead wires 32 so as to expose the terminals 34. The organic flattening layer 2Pb is formed on the inorganic protective layer 2Pa, and the OLED layer 3 is formed on the organic flattening layer 2Pb. The TFE structure 10A is formed so as to cover the OLED layer 3 and the organic flattening layer 2Pb. The OLED layer 3 and the organic flattening layer 2Pb are enclosed by the joint portion where the inorganic protective layer 2Pa and the first inorganic barrier layer 12 are in direct contact with each other. The organic barrier layer (solid portion) 14 between the first inorganic barrier layer 12 and the second inorganic barrier layer 16 in the TFE structure 10A is formed only in the vicinity of a protruding portion such as the particle or the like, and thus is not shown here. The organic barrier layer (solid portion) 14 is enclosed by the inorganic barrier layer joint portion, where the first inorganic barrier layer 12 and the second inorganic barrier layer 16 are in direct contact with each other.

As shown in FIG. 4(a), in a region closer to the active region R1 (cross-section taken along line 4A-4A' in FIG. 2), the inorganic protective layer 2Pa, the organic flattening layer 2Pb and the TFE structure 10A are formed on the lead wires 32.

As shown in FIG. 4(b), in a cross-section taken along line 4B-4B' in FIG. 2, the inorganic protective layer 2Pa and the first inorganic barrier layer 12 are in direct contact with each other, and the organic flattening layer 2Pb is enclosed by the joint portion where the inorganic protective layer 2Pa and the first inorganic barrier layer 12 are in direct contact with each other (see FIG. 2 and FIG. 3(b)).

As shown in FIG. 4(c), in a region closer to the terminals 34, only the inorganic protective layer 2Pa is formed on the lead wires 32.

As shown in FIG. 4(d), the terminals 34 are exposed also from the inorganic protective layer 2Pa and are used for electrical connection with an external circuit (e.g., FPCs (Flexible Printed Circuit)).

A region including the portions shown in FIG. 4(b) through FIG. 4(d) is not covered with the organic flattening layer 2Pb. Therefore, during the formation of the organic barrier layer 14 of the TFE structure 10A, an organic barrier layer (solid portion) may be formed in this region. For example, if a side surface of a cross-section, of the lead wires 32, that is parallel to the line width direction thereof has a tapering angle θ of 90 degrees or larger, an organic barrier layer may be formed along the side surface of each of the lead wires 32. However, as shown in FIG. 4(b) through FIG. 4(d), in the OLED display device 100A according to this embodiment, at least in this region, the tapering angle θ of the side surface of the cross-section of each of the lead wires 32 and each of the terminals 34 is smaller than 90 degrees, and thus the photocurable resin is not located locally. Therefore, the organic barrier layer (solid portion) is not formed along the side surface of any of the lead wires 32 or any of the terminals 34.

Now, with reference to FIG. 3(c), the tapering angle θ of the side surface of each of the layers will be described. FIG. 3(c) is a cross-sectional view showing the tapering angle θ of the side surface of each of the layers, and corresponds to, for example, the cross-section of FIG. 4(b). As shown in FIG. 3(c), the tapering angle θ of the side surface of the cross-section, of the lead wire 32, that is parallel to the width direction thereof will be represented as θ(32). The tapering angle θ of the side surface of each of the other layers will be represented in a similar manner with θ (reference sign of the component).

With such representations, the tapering angles θ of the side surface of the inorganic protective layer 2Pa formed on the lead wire 32, the side surface of the first inorganic barrier layer 12 of the TFE structure 10A formed on the inorganic protective layer 2Pa, and the side surface of the second inorganic barrier layer 16 of the TFE structure 10A formed on the inorganic protective layer 2Pa fulfill the relationship of θ(32)≥θ(2Pa)≥θ(12)≥θ(16). Therefore, if the tapering angle θ(32) of the side surface of the lead wire 32 is smaller than 90 degrees, the tapering angle θ(2Pa) of the side surface of the inorganic protective layer 2Pa and the tapering angle θ(12) of the side surface of the first inorganic barrier layer 12 are each also smaller than 90 degrees.

Assuming that the method for forming the organic barrier layer described in Patent Document No. 2 or 3 is used in the case where the tapering angle θ of the side surface is 90 degrees or larger, vapor of an organic material (e.g., acrylic monomer) or a mist-like organic material is condensed, and thus an organic barrier layer (solid portion) is formed, along a border between the side surface and the flat surface (making an angle of 90 degrees or smaller). When this occurs, for example, the organic barrier layer (solid portion) formed along the lead wire acts as a route that guides water vapor in the air into the active region.

Figure 5:
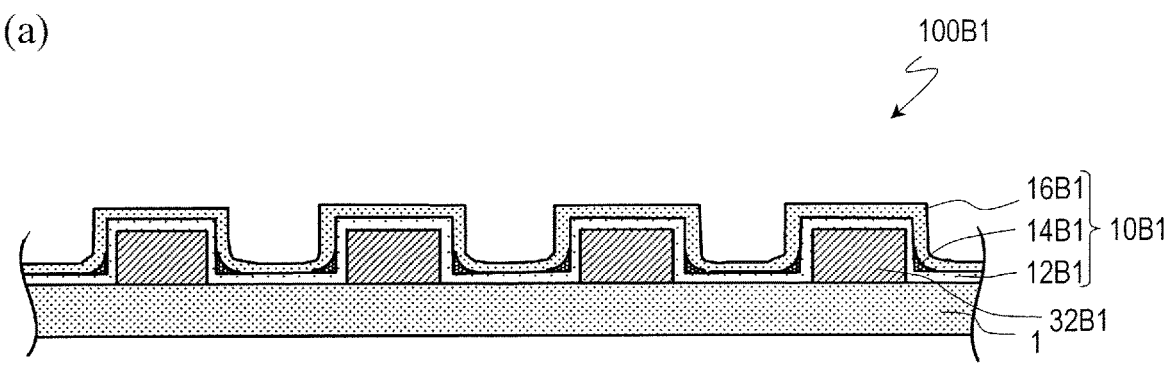
FIG. 5(a) and FIG. 5(b) are respectively schematic cross-sectional views of OLED display devices 100B1 and 100B2 according to comparative examples, each corresponding to FIG. 4(b).
Figure 5:
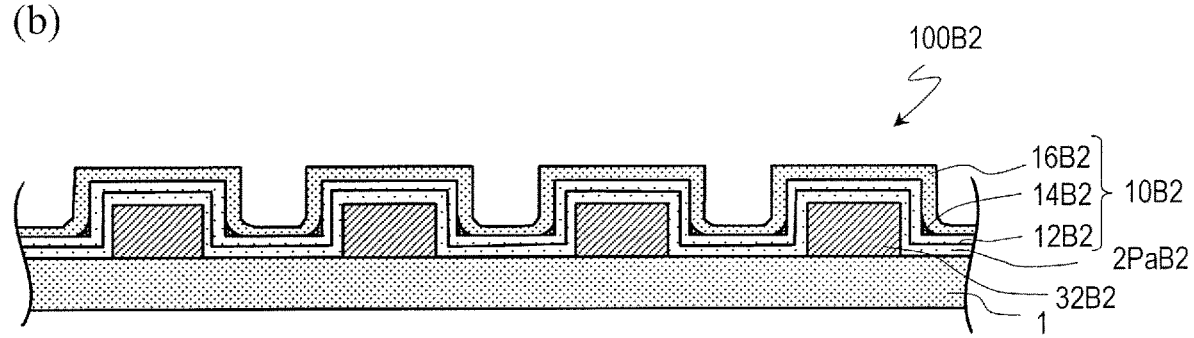

FIG. 5(a) is a schematic cross-sectional view of an OLED display device 100B1 according to a comparative example, and corresponds to FIG. 4(b). If, as shown in FIG. 5(a), a tapering angle θ(32B1) of a side surface of each of lead wires 32B1 and a tapering angle θ(12B1) of a side surface of a first inorganic barrier layer 12B1 are each 90 degrees or larger, an organic barrier layer (solid portion) 14B1 is formed between the first inorganic barrier layer 12B1 and a second inorganic barrier layer 16B1 of a TFE structure 10B1 along the side surface of the first inorganic barrier layer 12B1. The OLED display device 100B1 may be obtained by, for example, changing the OLED display device 100 according to an embodiment as follows. The inorganic protective layer 2Pa is omitted, and the tapering angle θ(32) of the side surface of the lead wire 32 and the tapering angle θ(12) of the side surface of the first inorganic barrier layer 12 are changed to 90 degrees or larger.

FIG. 5(b) is a schematic cross-sectional view of an OLED display device 100B2 according to a comparative example, and corresponds to FIG. 4(b). If, as shown in FIG. 5(b), a tapering angle θ(32B2) of a side surface of each of lead wires 32B2, a tapering angle θ(2PaB2) of a side surface of an inorganic protective layer 2PaB2 and a tapering angle θ(12B2) of a side surface of a first inorganic barrier layer 12B2 are each 90 degrees or larger, an organic barrier layer (solid portion) 14B2 is formed between the first inorganic barrier layer 12B2 and a second inorganic barrier layer 16B2 of a TFE structure 10B2 along the side surface of the first inorganic barrier layer 12B2. The OLED display device 100B2 may be obtained by, for example, changing the OLED display device 100A according to an embodiment as follows. The tapering angle θ(32) of the side surface of the lead wire 32 and the tapering angle θ(12) of the side surface of the first inorganic barrier layer 12 are changed to 90 degrees or larger.

Unlike the OLED display device 100B1, the OLED display device 100B2 includes the inorganic protective layer 2PaB2. Therefore, the tapering angle θ(12B2) of the side surface of the first inorganic barrier layer 12B2 is likely to be smaller than the tapering angle θ(12B1) of the side surface of the first inorganic barrier layer 12B1 of the OLED display device 100B1.

In the OLED display device 100A in an embodiment according to the present invention shown in FIG. 4(b) through FIG. 4(d), the tapering angles θ(32), θ(2Pa) and θ(12) of the side surfaces of the lead wire 32, the inorganic protective layer 2Pa and the first inorganic barrier layer 12 are all smaller than 90 degrees. Thus, the organic barrier layer 14 is not formed along these side surfaces. Therefore, moisture in the air does not reach the inside of the active region R1 via the organic barrier layer (solid portion) 14, and thus the OLED display device 100A may have a high level of moisture-resistant reliability. In this example, the tapering angles θ(32), θ(2Pa) and θ(12) are all smaller than 90 degrees. The present invention is not limited to this. It is sufficient that the tapering angle θ(12) of the side surface, of the first inorganic barrier layer 12, which forms a surface immediately below the organic barrier layer 14 has a tapering angle smaller than 90 degrees. With such a structure, the stack structure shown in FIG. 4(b) (the portion where the inorganic protective layer 2Pa and the first inorganic barrier layer 12 are in direct contact with each other (the organic flattening layer 2Pb is not present), and the portion where the first inorganic barrier layer 12 and the second inorganic barrier layer 16 are in direct contact with each other (the organic barrier layer 14 is not present)) is formed. Therefore, the situation may be suppressed or prevented where moisture in the air enters the inside of the active region R1 via the organic flattening layer 2Pb or the organic barrier layer 14. In addition, the provision of the inorganic protective layer 2Pa may decrease the tapering angle θ(12) of the first inorganic barrier layer 12. Therefore, even if the tapering angle θ(32) of the lead wire 32 is relatively large (e.g., 90 degrees), the tapering angle θ(12) of the first inorganic barrier layer 12 may be made smaller than 90 degrees. Namely, the tapering angle θ(32) of the lead wire 32 may be made 90 degrees or closer to 90 degrees. This provides an advantage that L/S of the lead wire 32 may be made smaller.

In the case where the tapering angle θ of the side surface is in the range of 70 degrees or larger and smaller than 90 degrees, the organic barrier layer (solid portion) 14 may be formed along the side surface. Needless to say, the resin present locally, namely, along the inclining side surface, may be removed by ashing. However, the ashing is time-consuming. For example, the ashing needs to be performed for a long time even after the resin formed on the flat surface is removed. Or, there may be a problem that as a result of the organic barrier layer (solid portion) formed in the vicinity of the particle P being excessively ashed (removed), the effect of the formation of the organic barrier layer is not fully provided. In order to suppress or prevent this problem, the tapering angle θ(12) of the first inorganic barrier layer 12 is preferably smaller than 70 degrees, and more preferably smaller than 60 degrees.

Now, with reference to FIG. 6 through FIG. 8, a structure of the OLED display device 100C according to a comparative example will be described. FIG. 6 is a schematic plan view of the OLED display device 100C. FIG. 7(a) and FIG. 7(b) are each a schematic cross-sectional view of the OLED display device 100C. FIG. 7(a) is a cross-sectional view taken along line 7A-7A' in FIG. 6, and FIG. 7(b) is a cross-sectional view taken along line 7B-7B' in FIG. 6. FIG. 8(a) through FIG. 8(c) are each a schematic cross-sectional view of the OLED display device 100C. FIG. 8(a) is a cross-sectional view taken along line 8A-8A' in FIG. 6. FIG. 8(b) is a cross-sectional view taken along line 8B-8B' in FIG. 6. FIG. 8(c) is a cross-sectional view taken along line 8C-8C' in FIG. 6.

Unlike in the OLED display device 100A according to an embodiment, in the OLED display device 100C, the inorganic protective layer 2Pa is not included, and the organic flattening layer 2Pbc is extended to a region that is not covered with a TFE structure 10C. Components substantially the same as those of the OLED display device 100A bear the identical reference signs thereto and descriptions thereof may be omitted.

As is clear from, for example, FIG. 6, FIG. 7(b) and FIG. 8(b), the organic flattening layer 2Pbc is partially exposed to the air (ambient atmosphere). In this case, the organic flattening layer 2Pbc absorbs moisture through the portion exposed to the air and acts as a route that guides water vapor in the air into the active region R1. By contrast, in the OLED display device 100A according to an embodiment, as shown in FIG. 3(b) and FIG. 4(b), the organic flattening layer 2Pb is enclosed, together with the OLED layer 3, by the joint portion where the inorganic protective layer 2Pa and the first inorganic barrier layer 12 are in direct contact with each other. Therefore, the above-described problem of the OLED display device 100C according to a comparative example may be solved.

Figure 9:
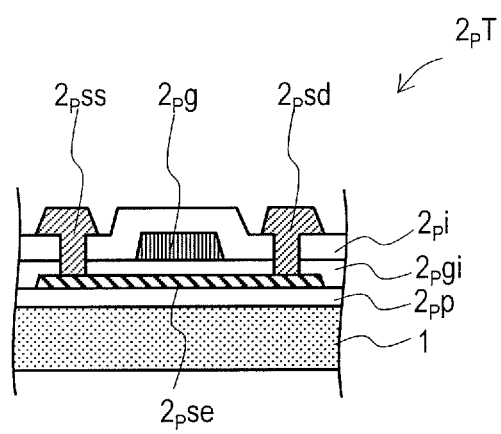
FIG. 9(a) and FIG. 9(b) are each a schematic cross-sectional view showing an example of TFT that may be included in an OLED display device according to an embodiment.
Figure 9:
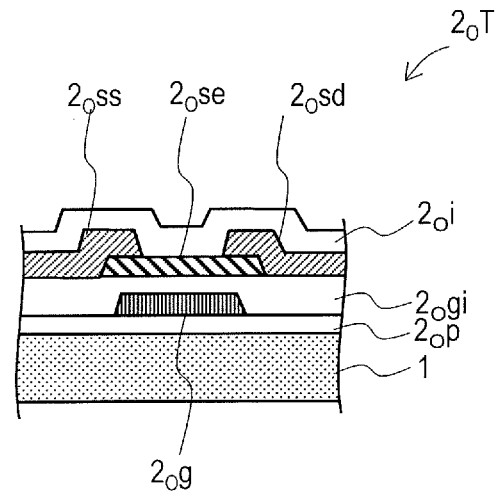
Figure 10:
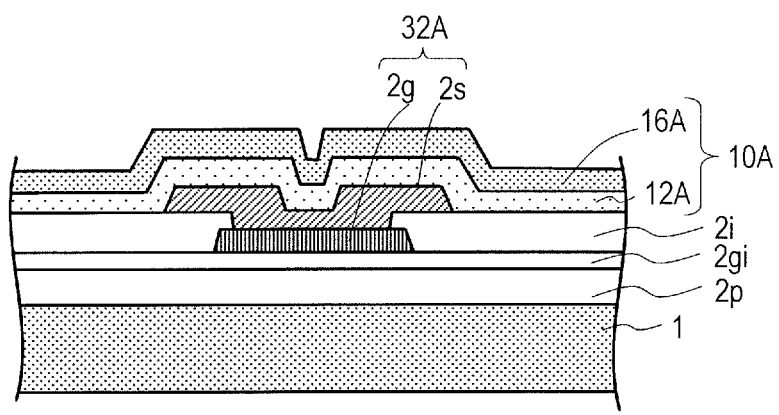
FIG. 10(a) through FIG. 10(c) are schematic cross-sectional views of another OLED display device according to an embodiment, respectively corresponding to FIG. 4(b) through FIG. 4(d).
Figure 10:
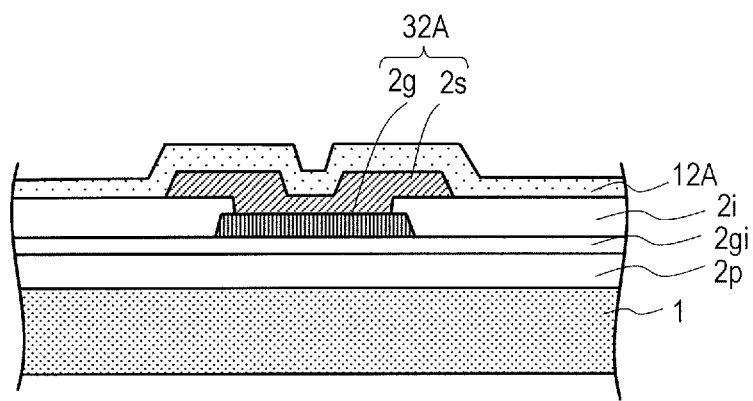
Figure 10:
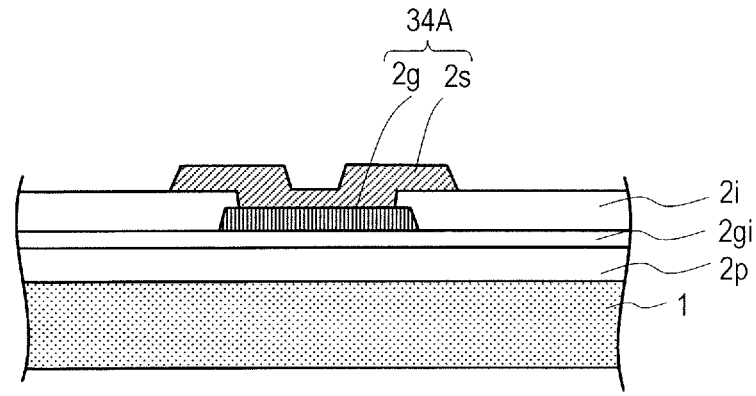

Now, with reference to FIG. 9 and FIG. 10, examples of TFT usable for the OLED display device 100A, and examples of lead wires and terminals formed by use of a gate metal layer and a source metal layer used to form the TFT, will be described. The structures of the TFT, the lead wires and the terminals described below may be used for the OLED display device 100A described above.

For a medium- or small-sized high-definition OLED display device, a low temperature polycrystalline silicon (hereinafter, referred to simply as "LTPS") TFT or an oxide TFT (e.g., four-component-based (In—Ga—Zn—O-based) oxide TFT containing In (indium), Ga (gallium), Zn (zinc) and O (oxygen)) having a high mobility is preferably used. Structures of, and methods for producing, the LTPS-TFT and the In—Ga—Zn—O-based TFT are well known and will be described below merely briefly.

FIG. 9(a) is a schematic cross-sectional view of an LTPS-TFT $2_pT$. The TFT $2_pT$ may be included in the circuit 2 of the OLED display device 100A. The LTPS-TFT $2_pT$ is a top gate-type TFT.

The TFT $2_pT$ is formed on a base coat $2_pp$ on the substrate (e.g., polyimide film) 1. Although not described above, it is preferred that a base coat formed of an inorganic insulating material is formed on the substrate 1.

The TFT $2_pT$ includes a polycrystalline silicon layer $2_pse$ formed on the base coat $2_pp$, a gate insulating layer $2_pgi$ formed on the polycrystalline silicon layer $2_pse$, a gate electrode $2_pg$ formed on the gate insulating layer $2_pgi$, an interlayer insulating layer $2_pi$ formed on the gate electrode $2_pg$, and a source electrode $2_pss$ and a drain electrode $2_psd$ formed on the interlayer insulating layer $2pi$. The source electrode $2_pss$ and the drain electrode $2_psd$ are respectively connected with a source region and a drain region of the polycrystalline silicon layer $2_pse$ in contact holes formed in the interlayer insulating layer $2_pi$ and the gate insulating layer $2_pgi$.

The gate electrode $2_pg$ is included in a gate metal layer including the gate bus lines, and the source electrode $2_pss$ and the drain electrode $2_psd$ are included in a source metal layer including the source bus lines. The gate metal layer and the source metal layer are used to form lead wires and terminals (described below with reference to FIG. 10).

The TFT $2_pT$ is formed, for example, as follows.

As the substrate 1, for example, a polyimide film having a thickness of 15 μm is prepared.

The base coat $2_pp$ (SiO$_2$ film: 250 nm/SiN$_x$ film: 50 nm/SiO$_2$ film: 500 nm (top layer/middle layer/bottom layer)) and an a-Si film (40 nm) are formed by plasma CVD.

The a-Si film is subjected to dehydrogenation (e.g., annealed at 450° C. for 180 minutes).

The a-Si film is polycrystalline-siliconized by excimer laser annealing (ELA).

The a-Si film is patterned by a photolithography step to form an active layer (semiconductor island).

A gate insulating film (SiO$_2$ film: 50 nm) is formed by plasma CVD.

A channel region of the active layer is doped with (B$^+$).

The gate metal layer (Mo: 250 nm) is formed by sputtering and patterned by a photolithography step (including a dry etching step) (to form the gate electrode $2_pg$, the gate bus lines, and the like).

The source region and the drain region of the active layer are doped with (P$^+$).

Activation annealing (e.g., annealing at 450° C. for 45 minutes) is performed. As a result, the polycrystalline silicon layer $2_pse$ is formed.

An interlayer insulating film (e.g., SiO$_2$ film: 300 nm/SiN$_x$ film: 300 nm (top layer/bottom layer)) is formed by plasma CVD.

The contact holes are formed in the gate insulating film and the interlayer insulating film by dry etching. As a result, the interlayer insulating layer $2_pi$ and the gate insulating layer $2_pgi$ are formed.

The source metal layer (Ti film: 100 nm/Al film: 300 nm/Ti film: 30 nm) is formed by sputtering and patterned by a photolithography step (including a dry etching step) (to form the source electrode $2_pss$, the drain electrode $2_psd$, the source bus lines, and the like).

After this, the inorganic protective layer 2Pa (see FIG. 2 and FIG. 3) described above is formed by, for example, plasma CVD.

FIG. 9(b) is a schematic cross-sectional view of an In—Ga—Zn—O-based TFT $2_oT$. The TFT $2_oT$ may be included in the circuit 2 of the OLED display device 100A. The TFT $2_oT$ is a bottom gate-type TFT.

The TFT $2_oT$ is formed on a base coat $2_op$ on the substrate 1 (e.g., polyimide film). The TFT $2_oT$ includes a gate electrode $2_og$ formed on the base coat $2_op$, a gate insulating layer $2_ogi$ formed on the gate electrode $2_og$, an oxide semiconductor layer $2_ose$ formed on the gate insulating layer $2_ogi$, and a source electrode $2_oss$ and a drain electrode $2_osd$ respectively formed on a source region and a drain region of the oxide semiconductor layer $2_ose$. The source electrode $2_oss$ and the drain electrode $2_osd$ are covered with an interlayer insulating layer $2_oi$.

The gate electrode $2_og$ is included in a gate metal layer including the gate bus lines, and the source electrode $2_oss$ and the drain electrode $2_osd$ are included in a source metal layer including the source bus lines. The gate metal layer and the source metal layer are used to form lead wires and terminals, and thus the TFT $2_oT$ may have a structure described below with reference to FIG. 10.

The TFT $2_oT$ is formed, for example, as follows.

As the substrate 1, for example, a polyimide film having a thickness of 15 μm is prepared.

The base coat $2_op$ ($SiO_2$ film: 250 nm/$SiN_x$ film: 50 nm/$SiO_2$ film: 500 nm (top layer/middle layer/bottom layer)) is formed by plasma CVD.

The gate metal layer (Cu film: 300 nm/Ti film: 30 nm (top layer/bottom layer)) is formed by sputtering and patterned by a photolithography step (including a dry etching step) (to form the gate electrode $2_og$, the gate bus lines, and the like).

A gate insulating film ($SiO_2$ film: 30 nm/$SiN_x$ film: 350 nm (top layer/bottom layer)) is formed by plasma CVD.

An oxide semiconductor film (In—Ga—Z—O-based semiconductor film: 100 nm) is formed by sputtering and patterned by a photolithography step (including a wet etching step) to form an active layer (semiconductor island).

The source metal layer (Ti film: 100 nm/Al film: 300 nm/Ti film: 30 nm (top layer/middle layer/bottom layer)) is formed by sputtering and patterned by a photolithography step (including a dry etching step) (to form the source electrode $2_oss$, the drain electrode $2_osd$, the source bus lines, and the like).

Activation annealing (e.g., annealing at 300° C. for 120 minutes) is performed. As a result, the oxide semiconductor layer $2_ose$ is formed.

Then, the interlayer insulating layer $2_oi$ (e.g., $SiN_x$ film: 300 nm/$SiO_2$ film: 300 nm (top layer/bottom layer)) is formed by plasma CVD as a protective film. The interlayer insulating layer $2_oi$ may also act as the inorganic protective layer 2Pa (see FIG. 2 and FIG. 3) described above. Needless to say, the inorganic protective layer 2Pa may further be formed on the interlayer insulating layer $2_oi$.

Now, with reference to FIG. 10(a) through FIG. 10(c), a structure of another OLED display device according to an embodiment will be described. The circuit (backplane) 2 of this OLED display device includes the TFT $2_pT$ shown in FIG. 9(a) or the TFT $2_oT$ shown in FIG. 9(b). The gate metal layer and the source metal layer used to form the TFT $2_pT$ or the TFT $2_oT$ are used to form a lead wire 32A and a terminal 34A. FIG. 10(a) through FIG. 10(c) respectively correspond to FIG. 4(b) through FIG. 4(d). Components corresponding to those in FIG. 4(b) through FIG. 4(d) will be represented by the identical reference signs thereto provided with letter "A" at the end. A base coat $2p$ in FIG. 10 corresponds to the base coat $2_pp$ in FIG. 9(a) and the base coat $2_op$ in FIG. 9(b). A gate insulating layer $2gi$ in FIG. 10 corresponds to the gate insulating layer $2_pgi$ in FIG. 9(a) and the gate insulating layer $2_ogi$ in FIG. 9(b). An interlayer insulating layer $2i$ in FIG. 10 corresponds to the interlayer insulating layer $2_pi$ in FIG. 9(a) and the interlayer insulating layer $2_oi$ in FIG. 9(b).

As shown in FIG. 10(a) through FIG. 10(c), a gate metal layer 2g and a source metal layer 2s are formed on the base coat 2p, which is formed on the substrate 1. Although not shown in FIG. 3 or FIG. 4, it is preferred that the base coat 2p formed of an inorganic insulating material is formed on the substrate 1.

As shown in FIG. 10(a) through FIG. 10(c), the lead wire 32A and the terminal 34A are each formed as a stack body of the gate metal layer 2g and the source metal layer 2s. A portion of the lead wire 32A and a portion of the terminal 34A that are formed of the gate metal layer 2g have, for example, the same cross-sectional shape as that of the gate bus lines. A portion of the lead wire 32A and a portion of the terminal 34A that are formed of the source metal layer 2s have, for example, the same cross-sectional shape as that of the source bus lines. In the case of, for example, a 5.7-type display device of 500 ppi, the portion formed of the gate metal layer 2g has a line width of, for example, 10 μm, and a distance between two adjacent such lines is 16 μm (L/S=10/16). The portion formed of the source metal layer 2s has a line width of, for example, 16 μm, and a distance between two adjacent such lines is 10 μm (L/S=16/10). These portions each have a tapering angle θ smaller than 90 degrees, preferably smaller than 70 degrees, and more preferably 60 degrees or smaller. The tapering angle of portions formed below the organic flattening layer Pb may be 90 degrees or larger.

Figure 11:
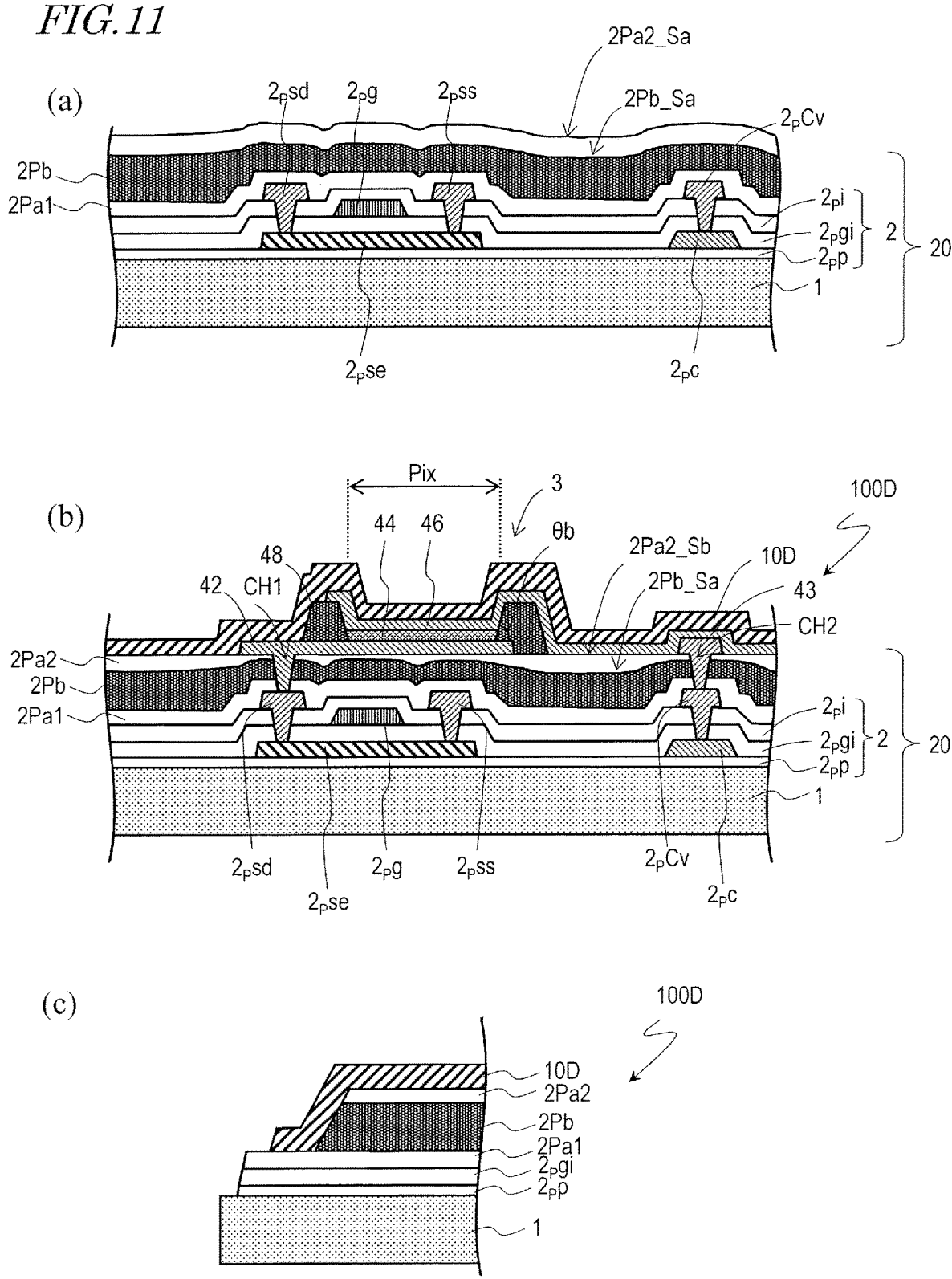
FIG. 11(a) through FIG. 11(c) are schematic cross-sectional views of still another OLED display device according to an embodiment.

Now, with reference to FIG. 11, a structure of, and a method for producing, another OLED display device according to another embodiment of the present invention will be described. The OLED display device shown in FIG. 11 includes an LTPS-TFT $2_pT$ shown in FIG. 9(a). Needless to say, the In—Ga—Zn—O-based TFT $2_oT$ shown in FIG. 9(b) may be used or any other known TFT may be used instead of the LTPS-TFT $2_pT$. FIG. 11(a) and FIG. 11(b) also show a common wire $2_pc$ and a contact portion $2_pcV$ to be electrically connected with an upper electrode (common electrode) 46 of the OLED.

Unlike in the above-described embodiments, the OLED display device 100D according to this embodiment further includes the second inorganic protective layer 2Pa2 formed on the organic flattening layer 2Pb. A surface of the second inorganic protective layer 2Pa2 has an arithmetic average roughness Ra of 50 nm or less.

The lower electrode and the organic layer (also referred to as an "organic EL layer"; includes at least an organic light emitting layer) of the OLED 3 are required to have a high flatness. If the flatness is low, for example, the OLED 3 has a low light emitting efficiency. The organic flattening layer 2Pb is formed of a liquid-state organic resin material (may contain a solvent) applied to the surface of the element substrate (the element substrate in the middle of production is also referred to as an "element substrate" for the sake of simplicity), and therefore, may absorb the recesses and protrusions (steps) of an underlying layer for the organic flattening layer 2Pb and form a flat surface. However, the surface of the organic flattening film formed of the liquid-state resin material has an arithmetic average roughness Ra (may be represented as "waviness") of greater than 100 nm and about 300 nm or less (see FIG. 11(a)). If the OLED 3 is formed on the organic flattening layer 2Pb having such a surface roughness, the light emitting efficiency may not be sufficiently improved. There is a problem that, for example, even if a micro-cavity structure is adopted, the effect thereof may not be sufficiently expressed.

Under such circumstances, according to an embodiment of the present invention, the second inorganic protective film is formed on the organic resin film formed as described above, and a surface of the second inorganic protective film is subjected to chemical mechanical polishing (hereinafter, referred to as "CMP"). The CMP allows the arithmetic average roughness Ra of the second inorganic protective film to be controlled to be 50 nm or less, preferably 30 nm or less. A smaller arithmetic average roughness Ra is more preferred, and there is no limitation on the lowest value thereof. The arithmetic average roughness Ra may be 10 nm or greater, or 20 nm or greater, in consideration of the relationship between the cost or time required for the CMP and the effect thereof.

The surface roughness may be measured by use of, for example, a confocal laser scanning microscope or an atomic force microscope (AFM). It is preferred that the range of measurement encompasses the center of the pixel and the vicinity thereof, and the reference length is appropriately set in accordance with the surface roughness.

In this specification, in order to distinguish flattening by the organic flattening layer 2Pb and flattening by the CMP from each other, the flattening by the CMP may be referred to as "smoothing".

FIG. 11(a) schematically shows a state immediately after the first inorganic protective film 2Pa1 to be the first inorganic protective layer 2Pa1, the organic flattening film 2Pb to be the organic flattening layer 2Pb, and the second inorganic protective film 2Pa2 to be the second inorganic protective layer 2Pa2 are formed on the driving circuit layer 2. The first inorganic protective film 2Pa1 and the second inorganic protective film 2Pa2 are each selectively formed in a desired region by use of a metal mask. The organic flattening film 2Pb is selectively formed in a desired region of the element substrate 20 by application of a material thereof, or is once formed on the entire surface of the element substrate 20 and then an unnecessary portion is removed. The first inorganic protective film 2Pa1 and the second inorganic protective film 2Pa2, which do not include an opening such as a contact hole or the like, are different from the first inorganic protective layer 2Pa1 and the second inorganic protective layer 2Pa2, but are represented by the identical reference signs thereto for the sake of simplicity. Similarly, the organic flattening film 2Pb, which does not include an opening such as a contact hole or the like, is different from the organic flattening layer 2Pb, but is represented by the identical reference sign thereto for the sake of simplicity. The first inorganic protective layer 2Pa1 and the second inorganic protective layer 2Pa2 are formed in substantially the same manner as the inorganic protective layer 2Pa described above.

A surface 2Pb_Sa of the organic flattening film 2Pb has an arithmetic average roughness Ra of greater than 100 nm and about 300 nm or less. In the case where the organic flattening film 2Pb is formed of a non-photosensitive resin, a surface having a smaller arithmetic average roughness may be obtained because of an effect provided by adding a leveling agent or the like than in the case where the organic flattening film 2Pb is formed of a photosensitive resin. Nonetheless, the arithmetic average roughness Ra of the surface exceeds 50 nm.

The surface roughness of a surface 2Pa2_Sa of the second inorganic protective film 2Pa2 formed on the surface 2Pb_Sa of the organic flattening film 2Pb described above reflects the surface roughness of the surface 2Pb_Sa of the organic flattening film 2Pb, and exceeds 50 nm.

Under such circumstances, in the OLED display device 100D according to an embodiment of the present invention, as shown in FIG. 11(b), a surface 2Pa2_Sb of the second inorganic protective film 2Pa2 is smoothed, and has an arithmetic average roughness Ra controlled to be 50 nm or less.

When being formed, the second inorganic protective film 2Pa2 has a thickness (FIG. 11(a)) that is at least about three times the arithmetic average roughness Ra of the surface 2Pb_Sa of the organic flattening film 2Pb, and has the surface thereof treated with CMP. The resultant surface 2Pa2_Sb has an arithmetic average roughness Ra of 50 nm or less. It is preferred that the arithmetic average roughness Ra of the surface 2Pa2_Sb is 30 nm or less. A smaller arithmetic average roughness Ra is more preferred, and there is no limitation on the lowest value thereof. The arithmetic average roughness Ra may be 10 nm or greater, or may be 20 nm or greater, in consideration of the relationship between the cost or time required for the CMP and the effect thereof.

In the case where, for example, the second inorganic protective film 2Pa2 is formed as a single layer of $SiN_x$ film by plasma CVD, the $SiN_x$ film may be formed at a film formation rate that does not exceed, for example, 10 nm/s. In this case, the arithmetic average roughness Ra of the surface 2Pb_Sa of the organic flattening film 2Pb, which is an underlying layer for the second inorganic protective film 2Pa2, is reflected almost as it is by the surface 2Pa2_Sa of the second inorganic protective film 2Pa2. Then, the second inorganic protective film 2Pa2 is treated with the CMP, and as a result, the surface 2Pa2_Sb of the second inorganic protective film 2Pa2 is smoothed to have an arithmetic average roughness Ra of 50 nm or less.

The CMP is performed by use of, for example, a slurry containing a neutral ceria ($CeO_2$)-based polishing agent or a slurry containing a fumed silica-based or colloidal silica-based polishing agent. Alternatively, a slurry containing alumina ($Al_2O_3$) powder may be used. As a chemical solution, a neutral aqueous solution or an alcohol is usable. Alternatively, in the case where the substrate 1 is a glass substrate, an aqueous solution of KOH is usable as the chemical solution. In the case where the substrate 1 is a polyimide film, a neutral chemical solution is preferred. A preferred load of a polishing pad is 50 $g/cm^2$ or greater and 150 $g/cm^2$ or less. A preferred rotation rate is 20 rpm or greater and 40 rpm or less. Polishing requires about 30 seconds to about 150 seconds.

In an OLED display device according to an embodiment of the present invention, the level of smoothing required to suppress the decrease in the light emitting efficiency is lower by one digit (the value of the arithmetic average roughness Ra is about ten times larger) than the level of smoothing required for a photographic process for a VLSI or a surface of an optical lens. Therefore, any of known polishing agents in a wide range generally usable for CMP is usable.

Smoothing the surface of the second inorganic protective layer 2Pa2 allows the lower electrode, the organic layer and the upper electrode of the OLED 3 formed on the second inorganic protective layer 2Pa2 to be smooth. This may improve the light emitting efficiency of the OLED display device.

Next, the first inorganic protective film 2Pa1, the organic flattening film 2Pb and the second inorganic protective film 2Pa2 each formed in a desired region of the element substrate 20 are patterned in one step to form openings such as contact holes CH1 and CH2 or the like. The patterning may be performed by, for example, dry etching by use of mixed gas of $O_2$ and $CF_4$. Therefore, the resin forming the organic flattening film 2Pb does not need to be photosensitive. As shown in FIG. 11(c), there is a portion where only the first inorganic protective layer 2Pa1 is left in order to form a portion where the first inorganic protective layer 2Pa1 and the first inorganic barrier layer (not shown) in the TFE structure 10D are in direct contact with each other. Such a structure may be formed by use of, for example, a gray-scale mask.

Next, a lower electrode 42 and an upper electrode contact portion 43 are formed. The lower electrode 42 is electrically connected with the drain electrode $2_p$sd in the contact hole CH1.

Next, a bank layer 48 defining each of the plurality of pixels Pix is formed. The bank layer 48 includes an opening corresponding to each of the pixels Pix. A side surface of the opening has an inclining surface including a forward tapering side surface portion. The inclining surface of the bank layer 48 encloses the corresponding pixel. The bank layer 48 is formed of, for example, a photosensitive resin (e.g., polyimide or acrylic resin). The bank layer 48 has a thickness of, for example, 1 µm or greater and 2 µm or less. The inclining surface of the bank layer 48 is inclined at an inclination angle of 60 degrees or smaller. If the inclination angle θb of the inclining surface of the bank layer 48 is larger than 60 degrees, a defect may be caused in layers located on the bank layer 48.

As described above, it is preferred to bake the resultant layers in order to remove moisture contained in the bank layer 48 and moisture contained in the organic flattening layer 2Pb. The baking temperature is preferably, for example, 100° C. or higher (e.g., for 1 hours or longer), and more preferably 250° C. or higher (e.g., for 15 minutes or longer). The atmosphere may be an atmospheric pressure. Baking in a low pressure atmosphere may shorten the baking time. It is preferred that the bank layer 48 and the organic flattening layer 2Pb are formed of a resin material having a high thermal resistance, for example, polyimide, in order to prevent deterioration by heat in the baking step.

After this, it may occur that the production of the element substrate is suspended and the element substrate is stored of transported. In such a case, a positive photoresist film may be formed to cover the surface of the element substrate including the layers up to the bank layer 48 as described above. After the storage or the transportation, the photoresist film is removed immediately before the organic layer 44 is formed, so that a clean surface may be provided. Immediately before the organic layer 44 is formed, the layers are baked to remove the moisture contained in the organic flattening layer 2Pb and the bank layer 48.

Next, the organic layer 44 is formed on the lower electrode 42. The organic layer 44 is formed by, for example, vapor deposition. The upper electrode 46 is formed on the organic layer 44. The upper electrode 46 is in contact with the upper electrode contact portion 43, and is electrically connected with the common wire $2_p$c via the contact portion $2_p$cV.

The lower electrode 42 and the upper electrode 46 respectively act as, for example, an anode and a cathode. The upper electrode 46 is a common electrode formed for the entirety of the pixels in the active region. The lower electrode (pixel electrode) 42 is formed for each of the pixels. In the structure in which the bank layer 48 is present between the lower electrode 42 and the organic layer 44, no holes are implanted from the lower electrode 42 into the organic layer 44.

Therefore, the region where the bank layer 48 is present does not act as a pixel Pix. For this reason, the bank layer 48 defines an outer perimeter of each of the pixels Pix. The bank layer 48 may be referred to as a "PDL (Pixel Defining Layer)".

After the OLED 3 is formed as described above, the TFE structure 10D is formed. The TFE structure 10D has substantially the same structure as that of the TFE structure 10A described above. Namely, the TFE structure 10D includes the first inorganic barrier layer (e.g., $SiN_x$ layer) 12, the organic barrier layer 14 and the second inorganic barrier layer (e.g., $SiN_x$ layer) 16, provided in this order with the first inorganic barrier layer 12 being closest to the OLED 3. As shown in FIG. 11(c), the first inorganic barrier layer 12 is in contact with the top surface and an inclining side surface of the second inorganic protective layer 2Pa2, an inclining side surface of the organic flattening layer 2Pb and a top surface of the first inorganic protective layer 2Pa1. Namely, the OLED display device 100D has substantially the same structure as that of the OLED display device 100A shown in FIG. 3(b) at an end thereof, and thus has a superb moisture-resistance reliability.

Figure 12:
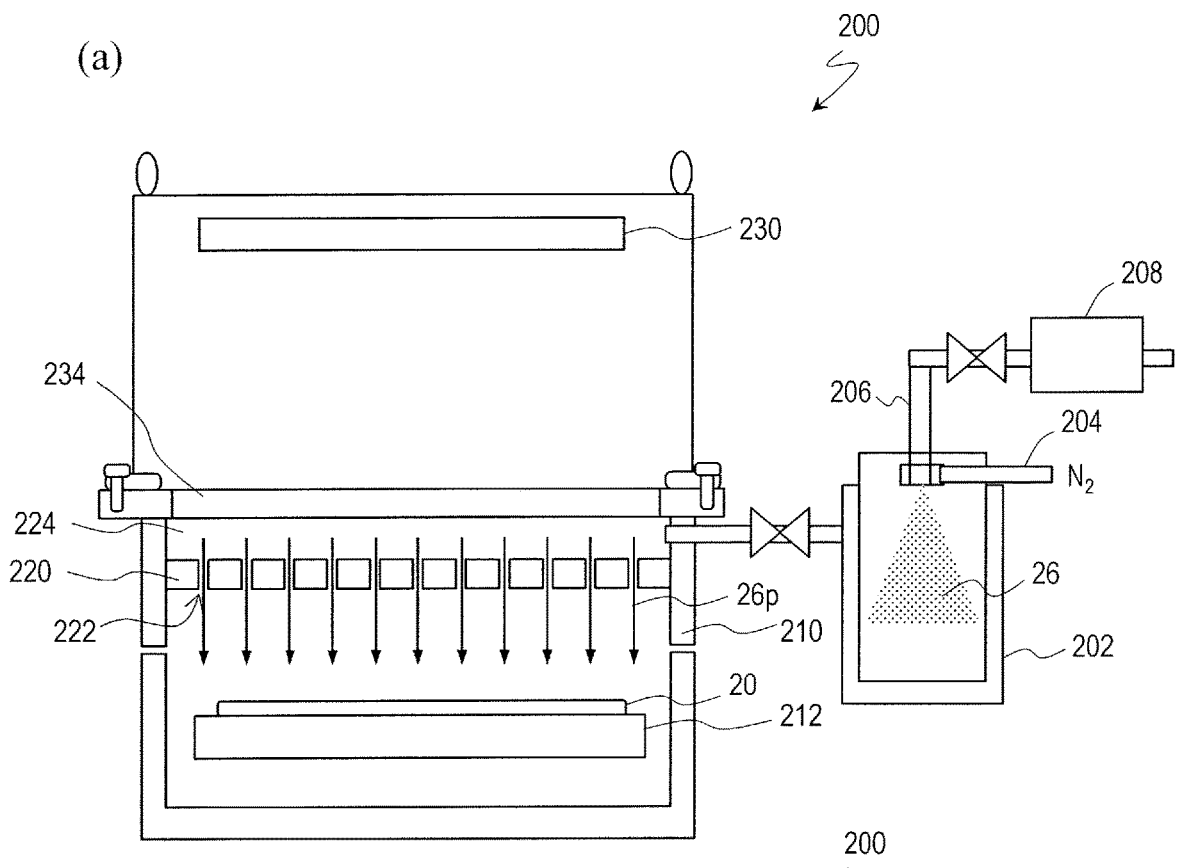
FIG. 12(a) and FIG. 12(b) schematically show a structure of a film formation device 200.
Figure 12:
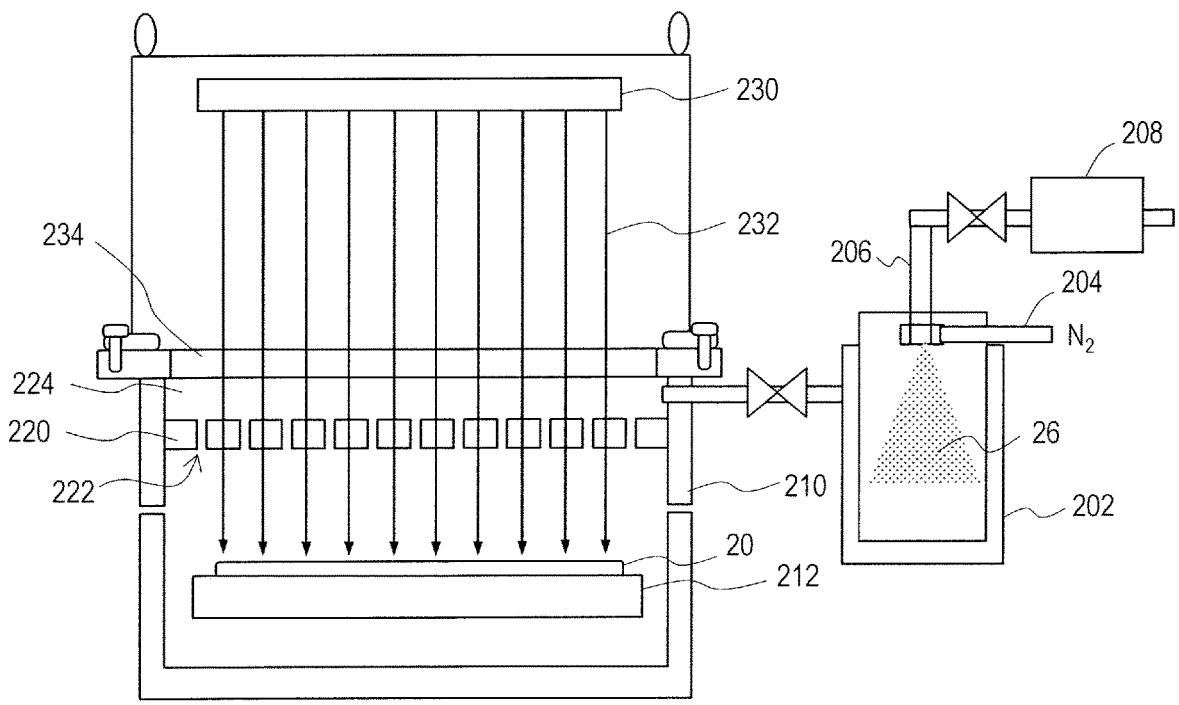

Now, with reference to FIG. 12(a) and FIG. 12(b), the film formation device 200 usable to form an organic barrier layer, and a film formation method using the same will be described. FIG. 12(a) and FIG. 12(b) schematically show a structure of the film formation device 200. FIG. 12(a) shows a state of the film formation device 200 in a step of, in a chamber having vapor of a photocurable resin or a mist-like photocurable resin located therein, condensing the photocurable resin on the first inorganic barrier layer. FIG. 12(b) shows a state of the film formation device 200 in a step of irradiating the photocurable resin with light to which the photocurable resin is sensitive and thus curing the photocurable resin.

The film formation device 200 includes a chamber 210 and a partition wall 234 dividing an inner space of the chamber 210 into two spaces. In one of the spaces, in the chamber 210, demarcated by the partition wall 234, a stage 212 and a shower plate 220 are located. In the other space demarcated by the partition wall 234, an ultraviolet irradiation device 230 is located. The inner space of the chamber 210 is controlled to have a predetermined pressure (vacuum degree) and a predetermined temperature. The stage 212 has a top surface that receives the element substrate 20 including the plurality of OLEDs 3, on which the first inorganic barrier layer is formed. The top surface may be cooled down to, for example, −20° C.

The shower plate 220 is located to have a gap 224 between the shower plate 220 and the partition wall 234. The shower plate 220 includes a plurality of through-holes 222. The gap 224 may have a size of, for example, 100 mm or longer and 1000 mm or shorter in a vertical direction. An acrylic monomer (vapor or mist-like) supplied to the gap 224 is supplied, via the plurality of through-holes 222 of the shower plate 220, to one of the spaces of the chamber 210 in which the stage 212 is located. When necessary, the acrylic monomer is heated. Vapor of an acrylic monomer or a mist-like acrylic monomer 26p is attached to, or contacts, the first inorganic barrier layer on the element substrate 20. An acrylic monomer 26 is supplied from a container 202 into the chamber 210 at a predetermined flow rate. The container 202 is supplied with the acrylic monomer 26 via a pipe 206 and is also supplied with nitrogen gas from a pipe 204. The flow rate of the acrylic monomer supplied to the container 202 is controlled by a mass flow controller 208. A material supply device includes the shower plate 220, the container 202, the pipes 204 and 206, the mass flow controller 208 and the like.

The ultraviolet irradiation device 230 includes an ultraviolet light source and optional optical elements. The ultraviolet light source may be, for example, an ultraviolet lamp (e.g., mercury lamp (encompassing a high-pressure lamp and a super-high pressure lamp), a mercury-xenon lamp or a metal halide lamp). The optical elements are, for example, a reflective mirror, a prism, a lens, and a diffraction element.

The ultraviolet irradiation device 230 emits light having a predetermined wavelength and a predetermined intensity toward the top surface of the stage 212 when being located at a predetermined position. It is preferred that the partition wall 234 and the shower plate 220 are formed of a material having a high transmittance to ultraviolet rays, for example, quartz.

The organic barrier layer 14 may be formed, for example, as follows by use of the film formation device 200. In this example, an acrylic monomer is used as the photocurable resin.

The acrylic monomer 26p is supplied into the chamber 210. The element substrate 20 has been cooled to, for example, −15° C. on the stage 212. The acrylic monomer 26p is condensed on the first inorganic barrier layer 12 on the element substrate 20. The conditions in this step may be controlled such that the liquid-state acrylic monomer is present locally, more specifically, only in the vicinity of the protruding portion of the first inorganic barrier layer 12. Alternatively, the conditions may be controlled such that the acrylic monomer condensed on the first inorganic barrier layer 12 forms a liquid film.

The viscosity and/or the surface tension of the photocurable resin in the liquid state may be adjusted to control the thickness of the liquid film or the shape of the portion of the liquid film that is to be in contact with the protruding portion of the first inorganic barrier layer 12 (namely, the shape of the recessed portion). For example, the viscosity and the surface tension depend on the temperature, and therefore, the temperature of the element substrate may be adjusted to control the viscosity and the surface tension. For example, the size of the solid portion that is present on the flat portion may be controlled by the shape of a portion, of the liquid film, that is to be in contact with the protruding portion of the first inorganic barrier layer 12 (namely, the shape of the recessed portion) and by the conditions of ashing to be performed in a later step.

Next, the ultraviolet irradiation device 230 is used to, typically, irradiate the entirety of a top surface of the element substrate 20 with ultraviolet rays 232 and thus to cure the acrylic monomer on the first inorganic barrier layer 12. As the ultraviolet light source, for example, a high-pressure mercury lamp that provides light having a main peak wavelength of 365 nm is used. The ultraviolet rays are directed at an intensity of, for example, 12 mW/cm$^2$ for about 10 seconds.

The organic barrier layer 14 formed of an acrylic resin is formed in this manner. The tact time of the step of forming the organic barrier layer 14 is, for example, shorter than about 30 seconds. Thus, the mass-productivity is very high.

Alternatively, after the photocurable resin in a liquid film state is cured, ashing may be performed to form the organic barrier layer 14 only in the vicinity of the protruding portion. Also in the case where the organic barrier layer 14 is formed by curing the photocurable resin present locally, the ashing may be performed. The ashing may improve the adhesiveness between the organic barrier layer 14 and the second inorganic barrier layer 16. Namely, the ashing may be used to modify (make hydrophilic) the surface of the organic barrier layer 14, as well as to remove an extra portion of the organic barrier layer once formed.

The ashing may be performed by use of a known plasma ashing device, a known photoexcitation ashing device, or a known UV ozone ashing device. For example, plasma ashing using at least one type of gas among $N_2O$, $O_2$ and $O_3$, or a combination of such plasma ashing and ultraviolet irradiation, may be performed. In the case where an $SiN_x$ film is formed by CVD as each of the first inorganic barrier layer 12 and the second inorganic barrier layer 16, $N_2O$ is used as a material gas. Therefore, use of $N_2O$ for the ashing provides an advantage that the device is simplified.

In the case where the ashing is performed, the surface of the organic barrier layer 14 is oxidized and thus is modified to be hydrophilic. In addition, the surface of the organic barrier layer 14 is shaved almost uniformly, and extremely minute convexed and concaved portions are formed, which increases the surface area size. The effect of increasing the surface area size provided by the ashing is greater for the surface of the organic barrier layer 14 than for the first inorganic barrier layer 12 formed of an inorganic material. Since the surface of the organic barrier layer 14 is modified to be hydrophilic and the surface area size of the surface is increased, the adhesiveness of the organic barrier layer 14 with the second inorganic barrier layer 16 is improved.

After the above, the resultant body is transported to a CVD chamber in order to form the second inorganic barrier layer 16. The second inorganic barrier layer 16 is formed under, for example, the same conditions as those for the first inorganic barrier layer 12. The second inorganic barrier layer 16 is formed in the region where the first inorganic barrier layer 12 is formed. Therefore, the inorganic barrier layer joint portion, where the first inorganic barrier layer 12 and the second inorganic barrier layer 16 are in direct contact with each other, is formed in the non-solid portion of the organic barrier layer 14. For this reason, as described above, water vapor in the air is suppressed or prevented from reaching the inside of the active region via the organic barrier layer.

The first inorganic barrier layer 12 and the second inorganic barrier layer 16 are formed, for example, as follows. An inorganic barrier layer having a thickness of 400 nm may be formed by plasma CVD using $SiH_4$ gas and $N_2O$ gas, at a film formation rate of 400 nm/min, in a state where, for example, the temperature of the substrate on which the inorganic barrier layer is to be formed (the temperature of the OLED 3) is controlled to be 80° C. or lower. The inorganic barrier layer thus formed has a refractive index of 1.84 and a transmittance of 90% to visible light having a wavelength of 400 nm (thickness: 400 nm). The inorganic barrier layer has a film stress having an absolute value of 50 MPa.

The inorganic barrier layer may be an $SiO_2$ layer, an $SiO_xN_y$ (x>y) layer, an $SiN_xO_y$ (x>y) layer, an $Al_2O_3$ layer or the like as well as an $SiN_x$ layer. Examples of the photocurable resin include vinyl group-containing monomers. Among the vinyl group-containing monomers, an acrylic monomer is preferably used. A photoinitiator may be incorporated into the acrylic monomer when necessary. As the acrylic monomer, any of various known acrylic monomers is usable. A plurality of acrylic monomers may be mixed together. For example, a two-functional monomer and a monomer including three or more functional groups may be mixed together. An oligomer may be mixed. The photocurable resin, before being cured, has a viscosity at room temperature (e.g., 25° C.) that is preferably lower than, or equal to, 10 Pa·s, and is especially preferably 1 to 100 mPa·s. If the viscosity is too high, it may be difficult to form a thin film having a thickness of 500 nm or less.

In the above, embodiments of an OLED display device including a flexible substrate and a method for producing the same are described. Embodiments of the present invention are not limited to those described above. Embodiments of the present invention are widely applicable to an organic EL device (e.g., organic EL illumination device) including an organic EL element formed on a substrate that is not flexible (e.g., glass substrate) and a thin film encapsulation structure formed on the organic EL element.

INDUSTRIAL APPLICABILITY

An embodiment of the present invention is applicable to an organic EL device and a method for producing the same. An embodiment of the present invention is especially preferably applicable to a flexible organic EL display device and a method for producing the same.

REFERENCE SIGNS LIST 1 substrate (flexible substrate)
2 backplane (circuit)
2Pa inorganic protective layer (first inorganic protective layer), inorganic protective film (first inorganic protective film)
2Pa1 first inorganic protective layer, first inorganic protective film
2Pa2 second inorganic protective layer, second inorganic protective film
2Pb organic flattening layer, organic flattening film
3 organic EL element
4 polarizing plate
10 thin film encapsulation structure (TFE structure)
12 first inorganic barrier layer ($SiN_x$ layer)
14 organic barrier layer (acrylic resin layer)
16 second inorganic barrier layer ($SiN_x$ layer)
20 element substrate
26 acrylic monomer
26p vapor of acrylic monomer or mist-like acrylic monomer
100, 100A, 100D organic EL display device
200 film formation device

The invention claimed is:
1. An organic electroluminescent device, comprising:
a substrate;
a driving circuit layer including a plurality of TFTs formed on the substrate, a plurality of gate bus lines, a plurality of source bus lines, a plurality of terminals, and a plurality of lead wires, each of the plurality of TFTs being connected one of the plurality of gate bus lines and one of the plurality of source bus lines, and each of the plurality of lead wires connecting one of the plurality of terminals and one of the plurality of gate bus lines, or one of the plurality of terminals and one of the plurality of source bus lines;
a first inorganic protective layer formed on the driving circuit layer and exposing at least the plurality of terminals;
an organic flattening layer formed on the first inorganic protective layer and the organic flattening layer is having an upper surface that has an arithmetic average roughness of greater than 50 nm;
a second inorganic protective layer formed on the upper surface of the organic flattening layer and the second inorganic protective layer is having an upper surface that has an arithmetic average roughness of 50 nm or less;
an organic electroluminescent element layer including a plurality of organic electroluminescent elements formed on the second inorganic protective layer and each connected with one of the plurality of TFTs; and
a thin film encapsulation structure formed so as to cover the organic electroluminescent element layer and including a first inorganic barrier layer, an organic barrier layer in contact with a top surface of the first inorganic barrier layer and a second inorganic barrier layer in contact with a top surface of the organic barrier layer, the organic barrier layer being formed in a region enclosed by an inorganic barrier layer joint portion where the first inorganic barrier layer and the second inorganic barrier layer are in direct contact with each other,
wherein as viewed in a direction of normal to the substrate, the organic flattening layer is formed in a region where the first inorganic protective layer is formed, the plurality of organic electroluminescent elements are located in a region where the organic flattening layer is formed, each of the plurality of lead wires continuously extends from a display region, which is covered by the thin film encapsulation structure, to a terminal of the plurality of terminals such that each of the plurality of lead wires extends beyond an outer perimeter of the thin film encapsulation structure, and an outer perimeter of the thin film encapsulation structure is present between an outer perimeter of the organic flattening layer and an outer perimeter of the first inorganic protective layer, and
wherein in a portion where the first inorganic protective layer and the first inorganic barrier layer are in direct contact with each other on the plurality of lead wires, a side surface of a cross-sectional shape, of the first inorganic barrier layer, that is parallel to a line width direction of the plurality of lead wires has a tapering angle of less than 90 degrees.
2. The organic electroluminescent device of claim 1, wherein the tapering angle of the side surface of the first inorganic barrier layer is less than 70 degrees.
3. The organic electroluminescent device of claim 1, wherein the organic flattening layer is formed of a non-photosensitive resin.
4. The organic electroluminescent device of claim 1, wherein the organic flattening layer is formed of polyimide.
5. A method for producing the organic electroluminescent device of claim 1, the method comprising:
step A of forming the driving circuit layer on the substrate;
step B of forming a first inorganic protective film on the driving circuit layer;
step C of forming an organic flattening film on the first inorganic protective film;
step D of forming a second inorganic protective film on the organic flattening film;
step E of treating a surface of the second inorganic protective film with chemical mechanical polishing;
step F of patterning the first inorganic protective film, the organic flattening film and the second inorganic protective film to form the first inorganic protective layer, the organic flattening layer and the second inorganic protective layer;

step G of baking the organic flattening layer to a temperature of 100° C. or higher; and step H of, after the step G, forming an organic layer on the second inorganic protective layer, the organic layer being contained in the organic electroluminescent elements.

6. The method of claim 5, wherein the step F includes the step of forming a contact hole running through the first inorganic protective film, the organic flattening film and the second inorganic protective film in one step.

7. The method of claim 5, further comprising: after the step F but before the step G, step F1 of forming a positive photoresist film covering the organic flattening layer, and step F2 of exposing the entirety of the photoresist film to light and then developing the photoresist film to remove the photoresist film.

8. The method of claim 7, further comprising the step of, between the step F1 and the step F2, storing or transporting the substrate having the photoresist film formed thereon.

9. The method of claim 5, further comprising:

step I of, after the step H, forming the first inorganic barrier layer selectively on an active region where the plurality of organic electroluminescent elements are formed;

step J of, after the step I, locating the substrate in a chamber and supplying vapor of a photocurable resin or a mist-like photocurable resin into the chamber;

step K of condensing the photocurable resin on the first inorganic barrier layer such that the photocurable resin is not present on a portion, of the first inorganic barrier layer, that has the tapering angle of less than 90 degrees; and step L of, after the step K, irradiating the condensed photocurable resin with light to form the organic barrier layer of a photocured resin.

10. The method of claim 5, further comprising:

step I of, after the step G, forming the first inorganic barrier layer selectively on an active region where the plurality of organic electroluminescent elements are formed;

step J of, after the step I, locating the substrate in a chamber and supplying vapor of a photocurable resin or a mist-like photocurable resin into the chamber;

step K of condensing the photocurable resin on the first inorganic barrier layer to form a liquid film;

step L of irradiating the liquid film of the photocurable resin with light to form a photocured resin layer; and step M of partially ashing the photocured resin layer to form the organic barrier layer.

11. The organic electroluminescent device of claim 1, wherein a plurality of terminals is provided at each end of the plurality of the lead wires.

* * * * *